United States Patent
Kim et al.

(10) Patent No.: US 10,396,134 B2
(45) Date of Patent: Aug. 27, 2019

(54) FLEXIBLE COLOR FILTER INTEGRATED WITH TOUCH SENSOR, ORGANIC LIGHT-EMITTING DISPLAY INCLUDING THE SAME, AND MANUFACTURING METHOD THEREOF

(71) Applicant: DONGWOO FINE-CHEM CO., LTD., Iksan-si, Jeollabuk-do (KR)

(72) Inventors: Duck Kyeom Kim, Seoul (KR); Ki Wan Kim, Sejong-si (KR); Myeong Won Lee, Incheon (KR); Young Kyun Hong, Seoul (KR)

(73) Assignee: DONGWOO FINE-CHEM CO., LDT., Iksan-Si (KR)

( * ) Notice: Subject to any disclaimer, the term of this patent is extended or adjusted under 35 U.S.C. 154(b) by 0 days.

(21) Appl. No.: 15/941,562

(22) Filed: Mar. 30, 2018

(65) Prior Publication Data
US 2018/0286926 A1 Oct. 4, 2018

(30) Foreign Application Priority Data
Mar. 31, 2017 (KR) .......................... 10-2017-0041720

(51) Int. Cl.
*H01L 21/00* (2006.01)
*H01L 27/32* (2006.01)
(Continued)

(52) U.S. Cl.
CPC .......... *H01L 27/323* (2013.01); *H01L 27/322* (2013.01); *H01L 51/003* (2013.01);
(Continued)

(58) Field of Classification Search
CPC . H01L 27/323; H01L 51/003; H01L 51/5253; H01L 27/322; H01L 51/56;
(Continued)

(56) References Cited

U.S. PATENT DOCUMENTS

2015/0255518 A1* 9/2015 Watanabe ........... H01L 27/1225
257/40
2015/0346866 A1* 12/2015 Kusunoki ............. H01L 27/323
345/174

FOREIGN PATENT DOCUMENTS

JP  2016027374 A  2/2016
KR  1020160017396 A  2/2016
(Continued)

OTHER PUBLICATIONS

Office Action issued in KR 10-2017-0041720 dated Jun. 9, 2017.

*Primary Examiner* — Vu A Vu
(74) *Attorney, Agent, or Firm* — DLA Piper LLP (US)

(57) ABSTRACT

The present invention relates to a flexible color filter integrated with a touch sensor, an organic light-emitting display including the same, and a manufacturing method thereof. The flexible color filter integrated with the touch sensor according to the present invention includes a color filter array formed on one surface of a separation layer, an overcoating layer formed on the color filter array, a touch sensor array formed on the overcoating layer, and a base film formed on the other surface of the separation layer. According to the present invention, a functional film, which is very thin, has high optical and flexible properties, and is formed by integrating a color filter with a touch sensor, and an organic light-emitting display to which the functional film is bonded may be implemented.

7 Claims, 26 Drawing Sheets

(51) Int. Cl.
*H01L 51/56* (2006.01)
*H01L 51/52* (2006.01)
*H01L 51/00* (2006.01)
*G06F 3/041* (2006.01)

(52) U.S. Cl.
CPC ...... *H01L 51/5253* (2013.01); *H01L 51/5268* (2013.01); *H01L 51/5275* (2013.01); *H01L 51/56* (2013.01); *G06F 3/041* (2013.01); *G06F 2203/04103* (2013.01); *H01L 2251/5338* (2013.01)

(58) Field of Classification Search
CPC ......... H01L 2251/5338; H01L 51/5275; G06F 2203/04103; G06F 3/041
USPC .......................................................... 438/24
See application file for complete search history.

(56) References Cited

FOREIGN PATENT DOCUMENTS

| | | |
|---|---|---|
| KR | 1020160081704 A | 7/2016 |
| KR | 1020160142763 A | 12/2016 |

* cited by examiner

FLEXIBLE COLOR FILTER INTEGRATED WITH TOUCH SENSOR, ORGANIC LIGHT-EMITTING DISPLAY INCLUDING THE SAME, AND MANUFACTURING METHOD THEREOF

CROSS-REFERENCE TO RELATED PATENT APPLICATION

This U.S. non-provisional patent application claims priority under 35 U.S.C. § 119 of Korean Patent Application No. 10-2017-0041720 filed on Mar. 31, 2017 in the Korean Patent Office, the entire contents of which are hereby incorporated by reference.

FIELD OF INVENTION

The present invention relates to a flexible color filter integrated with a touch sensor, an organic light-emitting display including the same, and a manufacturing method thereof. More specifically, the present invention relates to a functional film, which is very thin, has high optical and flexible properties and is formed by integrating a color filter with a touch sensor, an organic light-emitting display to which the functional film is bonded, and a manufacturing method thereof.

BACKGROUND

Generally, a touch sensor is a device which grasps a touch point in response to a touch when a user touches an image displayed on a screen with a finger or a touch pen. There are various types of touch sensors, such as capacitive touch sensors, resistive touch sensors, surface wave touch sensors using infrared rays or ultrasonic waves, and the like according to an application technique.

Such touch sensors are generally manufactured to have a structure capable of being mounted on displays such as liquid crystal displays (LCDs), organic light-emitting diodes (OLEDs), or the like. Recently, research on film-type touch sensors, which are more thin, light, and bendable, using a polymer film replacing a glass substrate as a base film is being actively conducted.

Further, generally, a polarizer is attached to an organic light-emitting display to improve optical properties of the organic light-emitting display, such as an antireflective property and the like, and a touch sensor in addition to the polarizer is attached to the organic light-emitting display to realize a touch interface with a user.

Meanwhile, since a thickness of such a polarizer is considerably thick, from about 100 to 150 μm, even though a thickness of the touch sensor is reduced to a minimum, when the polarizer and the touch sensor are separately attached to the organic light-emitting display, a flexible property of the organic light-emitting display is lowered due to the thickness of the polarizer.

DOCUMENTS OF RELATED ART

Patent Document (Patent Document 1) Korean Laid-open Patent Publication No. 10-2016-0081704 (Published on Jul. 8, 2016, Title: Flexible Organic Light-Emitting Display).
(Patent Document 2) Korean Laid-open Patent Publication No. 10-2016-0017396 (Published on Feb. 16, 2016, Title: Flexible Display and Manufacturing Method thereof).

SUMMARY OF THE INVENTION

Technical Problem

The present invention is directed to replacing an antireflective polarizer provided in an organic light-emitting display with a color filter so that an external light reflectance of the organic light-emitting display is reduced.

Further, the present invention is directed to integrating a touch sensor with a color filter so that two functional devices are mounted on one base film.

Further, the present invention is directed to integrating a touch sensor with a color filter so that an organic light-emitting display has a simplified manufacturing process because the number of optical bonding layers required for being attached to the organic light-emitting display is reduced, and has improved optical properties.

Further, the present invention is directed to reducing a thickness of a film in which a touch sensor and a color filter are integrated so that a flexible property of an organic light-emitting display is improved.

Further, the present invention is directed to using a color filter in place of a conventional polarizer so that the color reproducibility of an organic light-emitting display is improved.

Further, the present invention is directed to using various base films which are very thin and have high optical and flexible properties in place of a conventional rigid substrate so that selectivity with respect to a base film is increased.

Solution to Problem

A flexible color filter integrated with a touch sensor according to a first aspect of the present invention includes a color filter array formed on one surface of a separation layer, an overcoating layer formed on the color filter array, a touch sensor array formed on the overcoating layer, and a base film formed on the other surface of the separation layer.

A flexible color filter integrated with a touch sensor according to a second aspect of the present invention includes a color filter array formed on one surface of a separation layer, an overcoating layer formed on the color filter array, a touch sensor array formed on the overcoating layer, and a base film formed on the touch sensor array.

The flexible color filter integrated with the touch sensor according to both aspects of the present invention may further include a protective layer formed between the separation layer and the color filter array.

The flexible color filter integrated with the touch sensor according to both aspects of the present invention may further include a refractive index adjusting layer formed between the color filter array and the touch sensor array.

In the flexible color filter integrated with the touch sensor according to both aspects of the present invention, a refractive index of the refractive index adjusting layer may range from 1.50 to 1.87.

A flexible organic light-emitting display including the flexible color filter integrated with the touch sensor according to the first aspect of the present invention includes a color filter array formed on one surface of a separation layer, an overcoating layer formed on the color filter array, a touch sensor array formed on the overcoating layer, a base film formed on the other surface of the separation layer, and an organic light-emitting diode bonded to the touch sensor array with a bonding layer interposed therebetween.

A flexible organic light-emitting display including the flexible color filter integrated with the touch sensor according to the second aspect of the present invention includes a color filter array formed on one surface of a separation layer, an overcoating layer formed on the color filter array, a touch sensor array formed on the overcoating layer, a base film formed on the touch sensor array, and an organic light-emitting diode bonded to the other surface of the separation layer with a bonding layer interposed therebetween.

The flexible organic light-emitting display including the flexible color filter integrated with the touch sensor according to both aspects of the present invention may further include a protective layer formed between the separation layer and the color filter array.

The flexible organic light-emitting display including the flexible color filter integrated with the touch sensor according to both aspects of the present invention may further include a refractive index adjusting layer formed between the color filter array and the touch sensor array.

In the flexible organic light-emitting display including the flexible color filter integrated with the touch sensor according to both aspects of the present invention, a refractive index of the refractive index adjusting layer may range from 1.50 to 1.87.

A manufacturing method of the flexible color filter integrated with the touch sensor according to the first aspect of the present invention includes forming a separation layer on a carrier substrate, forming a color filter array on one surface of the separation layer, forming an overcoating layer on the color filter array, forming a touch sensor array on the overcoating layer, separating the carrier substrate from the separation layer and exposing the other surface of the separation layer, and forming a base film on the other surface of the separation layer.

A manufacturing method of the flexible color filter integrated with the touch sensor according to the second aspect of the present invention includes forming a separation layer on a carrier substrate, forming a color filter array on one surface of the separation layer, forming an overcoating layer on the color filter array, forming a touch sensor array on the overcoating layer, separating the carrier substrate from the separation layer, and forming a base film on the touch sensor array.

The manufacturing method of the flexible color filter integrated with the touch sensor according to both aspects of the present invention may further include forming a protective layer between the separation layer and the color filter array.

The manufacturing method of the flexible color filter integrated with the touch sensor according to both aspects of the present invention may further include forming a refractive index adjusting layer between the color filter array and the touch sensor array.

In the manufacturing method of the flexible color filter integrated with the touch sensor according to both aspects of the present invention, a refractive index of the refractive index adjusting layer may range from 1.50 to 1.87.

The manufacturing method of the flexible color filter integrated with the touch sensor according to the first aspect of the present invention may further include forming a first protective film on the touch sensor array before the separating of the carrier substrate from the separation layer.

The manufacturing method of the flexible color filter integrated with the touch sensor according to the second aspect of the present invention may further include forming a first protective film on the touch sensor array before the separating of the carrier substrate from the separation layer, and forming a second protective film on the other surface of the separation layer after the separating of the carrier substrate from the separation layer.

A manufacturing method of an organic light-emitting display including the flexible color filter integrated with the touch sensor according to the first aspect of the present invention includes forming a separation layer on a carrier substrate, forming a color filter array on one surface of the separation layer, forming an overcoating layer on the color filter array, forming a touch sensor array on the overcoating layer, separating the carrier substrate from the separation layer and exposing the other surface of the separation layer, forming a base film on the other surface of the separation layer, and bonding the touch sensor array to an organic light-emitting diode with a bonding layer interposed therebetween.

A manufacturing method of an organic light-emitting display including the flexible color filter integrated with the touch sensor according to the second aspect of the present invention includes forming a separation layer on a carrier substrate, forming a color filter array on one surface of the separation layer, forming an overcoating layer on the color filter array, forming a touch sensor array on the overcoating layer, separating the carrier substrate from the separation layer, forming a base film on the touch sensor array, and bonding the separation layer to an organic light-emitting diode with a bonding layer interposed therebetween.

The manufacturing method of an organic light-emitting display including the flexible color filter integrated with the touch sensor in both aspects of the present invention may further include forming a refractive index adjusting layer between the color filter array and the touch sensor array.

DETAILED DESCRIPTION OF THE INVENTION

Figure 1:
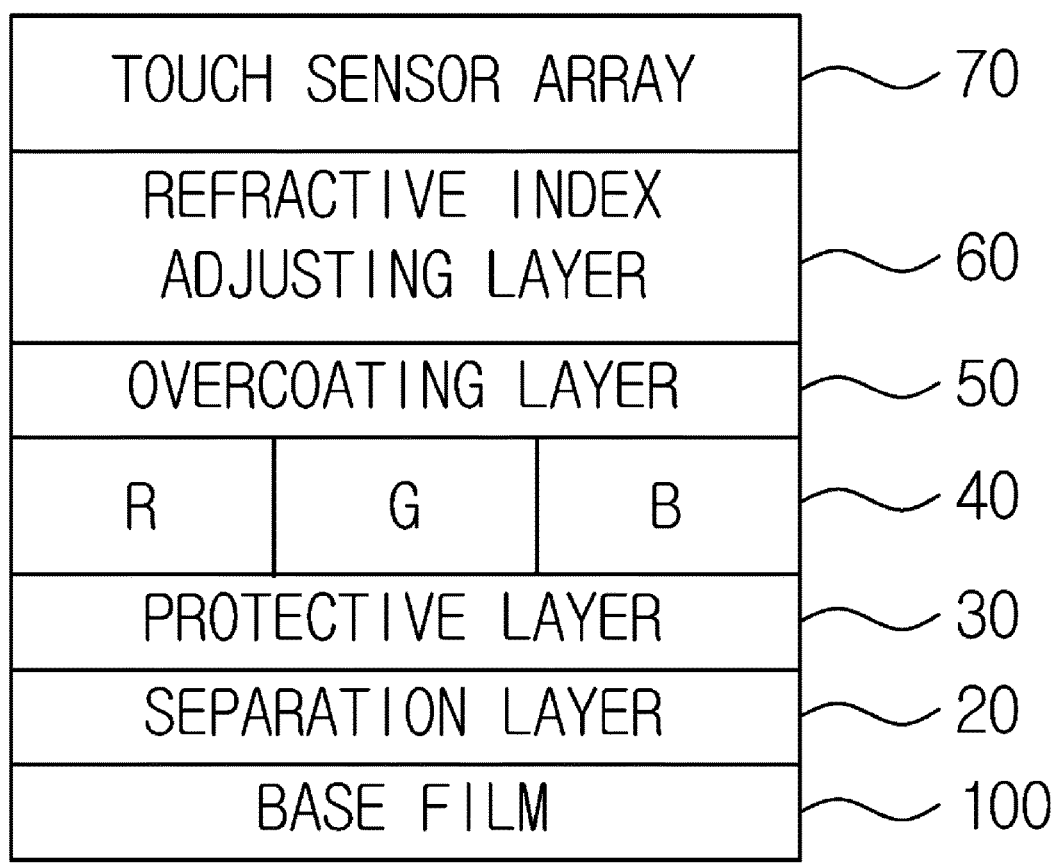
FIG. 1 is a view showing a flexible color filter integrated with a touch sensor according to a first embodiment of the present invention.

Specific structural and functional descriptions of embodiments of the present invention disclosed in this specification are only for the purpose of describing embodiments of the present invention, and the embodiments of the present invention may be embodied in various forms and are not to be construed as limited to the embodiments described in this specification.

While the embodiments of the present invention may be modified in various ways and take on various alternative forms, specific embodiments thereof are shown in the drawings and described in detail in this specification. There is no intent to limit the present invention to the particular forms disclosed. On the contrary, the present invention is to cover all modifications, equivalents, and alternatives falling within the spirit and scope of the appended claims.

It should be understood that, although the terms "first," "second," and the like may be used herein to describe various elements, the elements are not limited by the terms. The terms are only used to distinguish one element from another element. For example, a first element could be termed a second element, and, similarly, a second element could be termed a first element, without departing from the scope of the present invention.

It should be understood that when an element is referred to as being "connected" or "coupled" to another element, the element may be directly connected or coupled to another element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," and the like.).

The terminology used herein is for the purpose of describing particular embodiments only and is not intended to be limiting to the present invention. As used herein, the singular forms "a," "an," and "the" are intended to also include the plural forms, unless the context clearly indicates otherwise. In other words, elements of the present invention referred to in the singular may number one or more unless the context clearly indicates otherwise. It should be further understood that the terms "comprise," "comprising," "include," and/or "including," when used herein, specify the presence of stated features, integers, steps, operations, elements, parts, or combinations thereof, but do not preclude the presence or addition of one or more other features, integers, steps, operations, elements, parts, or combinations thereof.

Unless otherwise defined, all terms including technical and scientific terms used herein have the same meaning as commonly understood by one of ordinary skill in the art to which this invention belongs. It should be further understood that terms, such as those defined in commonly used dictionaries, should be interpreted as having a meaning that is consistent with their meaning in the context of the relevant art and are not to be interpreted in an idealized or overly formal sense unless expressly so defined herein.

Hereinafter, exemplary embodiments of the present invention will be described in detail with reference to the accompanying drawings.

FIG. 1 is a view showing a flexible color filter integrated with a touch sensor according to a first embodiment of the present invention.

Referring to FIG. 1, the flexible color filter integrated with the touch sensor according to the first embodiment of the present invention includes a separation layer 20, a protective layer 30, a color filter array 40, an overcoating layer 50, a refractive index adjusting layer 60, a touch sensor array 70, and a base film 100.

In the flexible color filter integrated with the touch sensor according to the first embodiment of the present invention, the color filter array 40, which replaces a function of a conventional polarizer, is integrated with the touch sensor and attached to an organic light-emitting display, and thus an external light reflectance of the organic light-emitting display may be reduced, the color reproducibility thereof may be increased, and a thickness of a functional film attached to the organic light-emitting display may be reduced.

The separation layer 20 is a layer formed for separating the flexible color filter integrated with the touch sensor from a carrier substrate 10 (in FIG. 6) formed of a rigid material, such as glass or the like, in the process of manufacturing the flexible color filter integrated with the touch sensor according to the first embodiment of the present invention.

A material of the separation layer 20 is not particularly limited as long as the material satisfies conditions for providing a certain level of separation force and transparency. For example, the separation layer 20 may be formed of a polymer, such as a polyimide-based polymer, a poly vinyl alcohol-based polymer, a polyamic acid-based polymer, a polyamide-based polymer, a polyethylene-based polymer, a polystylene-based polymer, a polynorbornene-based polymer, a phenylmaleimide copolymer-based polymer, a polyazobenzene-based polymer, a polyphenylenephthalamide-based polymer, a polyester-based polymer, a polymethyl methacrylate-based polymer, a polyarylate-based polymer, a cinnamate-based polymer, a coumarin-based polymer, a phthalimidine-based polymer, a chalcone-based polymer, an aromatic acetylene-based polymer, or the like, and one polymer of the above polymers may be used or two or more polymers may be mixed and used.

The separation force of the separation layer 20 is not particularly limited, but may be, for example, in a range of 0.01 N/25 mm to 1 N/25 mm, and preferably, in a range of 0.01 N/25 mm to 0.1 N/25 mm. When the separation force of the separation layer 20 satisfies the above range, the flexible color filter integrated with the touch sensor may be easily separated from the carrier substrate 10 (in FIG. 6) without any residue in the process of manufacturing the flexible color filter integrated with the touch sensor, and curls and cracks due to a tensile force generated during the separation may be reduced.

A thickness of the separation layer 20 is not particularly limited, but may be, for example, in a range of 10 to 1,000 nm, and preferably, in a range of 50 to 500 nm. When the thickness of the separation layer 20 satisfies the above range, a pattern having stable and uniform separation force may be formed.

The protective layer 30 is formed between the separation layer 20 and the color filter array 40, and may be an optional component that can be omitted as necessary. The protective layer 30 prevents damage on the separation layer 20 by being exposed to a process chemical, such as a photoresist (PR) solvent for a color filter used for forming the color filter array 40, a developing solution, a cleaning solution generated in the process, or the like, during the process of manufacturing the flexible color filter integrated with the touch sensor according to the first embodiment of the present invention.

Any polymer known in the art may be used as a material for the protective layer 30 without limitation, and for example, an organic insulating film may be applied to the protective layer 30. The protective layer 30 may be formed of a curable composition containing a polyol and a melamine curing agent among the polymers, but the present invention is not limited thereto.

Specific examples of the polyol include polyether glycol derivatives, polyester glycol derivatives, polycaprolactone glycol derivatives, and the like, but the present invention is not limited thereto.

Specific examples of the melamine curing agent include methoxy methyl melamine derivatives, methyl melamine derivatives, butyl melamine derivatives, isobutoxy melamine derivatives, butoxy melamine derivatives, and the like, but the present invention is not limited thereto.

As another example, the protective layer 30 may be formed of an organic-inorganic hybrid curable composition, and when an organic compound and an inorganic compound are simultaneously used, cracks generated during the separation may be preferably reduced.

The above-described components may be used as the organic compound, and silica-based nanoparticles, silicon-based nanoparticles, glass nanofibers, or the like may be used as the inorganic compound, but the present invention is not limited thereto.

The color filter array 40 is formed on the protective layer 30, and functions to reduce an external light reflectance and improve the color reproducibility of the display. The protective layer 30 is a component that can be omitted, and when the protective layer 30 is omitted, the color filter array 40 is formed on one surface of the separation layer 20.

The overcoating layer 50 is formed on the color filter array 40.

The overcoating layer 50 performs a function of planarization. Specifically, the overcoating layer 50 prevents a phenomenon in which pixels constituting the color filter array 40 are deformed due to a step that can be generated by electrode patterns constituting the touch sensor array 70 and color sense is distorted. For example, a thickness of the overcoating layer 50 is preferably about 2 μm or more, and an organic insulating material may be applied as a constituent material of the overcoating layer 50.

Further, the overcoating layer 50 functions to protect the components during a subsequent etching process. Specifically, when the overcoating layer 50 is formed on the color filter array 40 and sensing electrode patterns constituting the touch sensor array 70 are then formed by chemical etching or the like, the components including the color filter array 40 may be protected because the overcoating layer 50 prevents the color filter array 40 from being exposed to an etching solution.

The refractive index adjusting layer 60 is formed between the color filter array 40 and the touch sensor array 70, and functions to improve optical properties such as light transmittance and the like by compensating for a refractive index difference between functional layers constituting the flexible color filter integrated with the touch sensor according to the first embodiment of the present invention.

For example, the refractive index adjusting layer 60 may be formed of a material having a high refractive index, and may have a refractive index of 1.50 to 1.87 and a thickness of 30 nm to 2,000 nm.

For example, the refractive index adjusting layer 60 may be a single film or a multilayer film, and may be formed by a deposition process or a wet coating process in consideration of upper and lower refractive indexes.

For example, the refractive index adjusting layer 60 may include an inorganic insulating film. As a specific example, the refractive index adjusting layer 60 may include one or more selected from the group consisting of $Al_2O_3$, MgO, $NdF_3$, SiON, $Y_2O_3$, ZnO, $TiO_2$, $ZrO_2$, and $Nb_2O_5$.

As another example, the refractive index adjusting layer 60 may include an organic insulating film. As a specific example, the refractive index adjusting layer 60 may include an organic matter containing inorganic fine particles.

When the refractive index adjusting layer 60 includes the organic matter containing the inorganic fine particles, the organic matter may include one or more selected from the group consisting of an acrylic resin, a urethane resin, a melamine resin, an alkyd resin, a siloxane-based polymer, and an organic silane condensate, but the present invention is not limited thereto.

When the refractive index adjusting layer 60 includes the organic matter containing the inorganic fine particles, the inorganic fine particles may include one or more selected from the group consisting of $Al_2O_3$, MgO, $NdF_3$, SiON, $Y_2O_3$, ZnO, $TiO_2$, $ZrO_2$, and $Nb_2O_5$, but the present invention is not limited thereto.

When the refractive index adjusting layer 60 includes the organic matter containing the inorganic fine particles, a refractive index of the refractive index adjusting layer 60 may be adjusted, for example, by adjusting a content of the inorganic fine particles. For example, the refractive index of the refractive index adjusting layer 60 may be increased by increasing the content of the inorganic fine particles, and conversely, the refractive index of the refractive index adjusting layer 60 may be lowered by reducing the content of the inorganic fine particles.

The touch sensor array 70 is formed on the refractive index adjusting layer 60. When the refractive index adjusting layer 60 is omitted, the touch sensor array 70 is formed on the overcoating layer 50.

The touch sensor array 70 is a component for sensing a touch signal input by a user.

For example, the sensing electrode patterns constituting the touch sensor array 70 may be formed to have an appropriate shape according to requirements of electronic devices desired to be used. For example, the touch sensor array 70 may include an electrode pattern for sensing an x coordinate and an electrode pattern for sensing a y coordinate, but the present invention is not limited thereto.

Any transparent conductive material may be used as the sensing electrode patterns constituting the touch sensor array 70 without limitation. For example, the sensing electrode patterns constituting the touch sensor array 70 may be formed of a material selected from among a metal oxide selected from the group consisting of indium tin oxide (ITO), indium zinc oxide (IZO), indium zinc tin oxide (IZTO), aluminum zinc oxide (AZO), gallium zinc oxide (GZO), florine tin oxide (FTO), indium tin oxide-silver-indium tin oxide (ITO-Ag-ITO), indium zinc oxide-silver-indium zinc oxide (IZO-Ag-IZO), indium zinc tin oxide-silver-indium zinc tin oxide (IZTO-Ag-IZTO), and aluminum zinc oxide-silver-aluminum zinc oxide (AZO-Ag-AZO), a metal selected from the group consisting of gold (Au), silver (Ag), copper (Cu), molybdenum (Mo), and allylpalladium(II) chloride dimer (APC), a nanowire formed of a metal selected from the group consisting of gold, silver, copper, and lead, a carbon-based material selected from the group consisting of carbon nanotubes (CNT) and graphene, and a conductive polymer material selected from the group consisting of poly(3,4-ethylenedioxythiophene) (PEDOT) and polyaniline (PANT). One polymer of the above transparent conductive material may be used or two or more polymers may be mixed and used, and preferably, indium tin oxide may be used. Both crystalline and amorphous indium tin oxides are available to be used.

A thickness of the touch sensor array 70 is not particularly limited, but the thickness of the touch sensor array 70 is preferably as thin as possible in consideration of the flexibility of the touch sensor.

For example, the sensing electrode patterns constituting the touch sensor array 70 may be polygonal patterns having a triangular shape, a tetragonal shape, a pentagonal shape, a hexagonal shape, or a heptagonal shape, or the like, independently of each other.

For example, the touch sensor array 70 may include a regular pattern. The regular pattern means that the pattern shape has regularity. For example, the sensing electrode patterns may include patterns having a mesh shape such as a rectangular shape or a square shape, or having a shape such as a hexagonal shape, independently of each other.

For example, the touch sensor array 70 may include an irregular pattern. The irregular pattern means that the pattern shape does not have regularity.

For example, when the sensing electrode patterns constituting the touch sensor array 70 are formed of a material such as a metal nanowire, a carbon-based material, a polymeric material, or the like, the sensing electrode patterns may have a net structure. When the sensing electrode patterns have a net structure, signals are sequentially transmitted to adjacent patterns in contact with each other, so that a pattern having high sensitivity may be realized.

For example, the sensing electrode patterns constituting the touch sensor array 70 may be formed as a single layer or a plurality of layers.

The base film 100 is formed on the other surface of the separation layer 20, and may be a transparent optical film.

For example, a film having a transparency of 80% or more at a level commonly used in the art and having high mechanical strength or high thermal stability may be used as the base film 100, but the present invention is not limited thereto.

As a specific example, the base film 100 may include a film made of a thermoplastic resin which is a polyester-based resin such as polyethylene terephthalate, polyethylene isophthalate, polyethylene naphthalate, polybutylene terephthalate, or the like, a cellulose-based resin such as diacetylcellulose, triacetylcellulose, or the like, a polycarbonate resin, an acrylic-based resin such as polymethyl (meth)acrylate, polyethyl(meth)acrylate, or the like, a styrene-based resin such as polystyrene, acrylonitrile-styrene copolymer, or the like, a polyolefin-based resin such as polyethylene, polypropylene, a polyolefin having a cyclo or norbornene structure, ethylene-propylene copolymers, or the like, a vinyl-chloride-based resin, an amide-based resin such as nylon, aromatic polyamide, or the like, an imide-based resin, a polyether-sulfone-based resin, a sulfone-based resin, a polyether-ether-ketone-based resin, a sulfide-polyphenylene-based resin, a vinyl-alcohol-based resin, a vinylidene-chloride-based resin, a vinyl-butyral-based resin, an allylate-based resin, a polyoxymethylene-based resin, an epoxy-based resin, or the like, and may include a film made of a blend of the thermoplastic resin. Further, the base film 100 may include a film made of a thermosetting resin such as a (meth)acrylic-based resin, a urethane-based resin, an acrylic-urethane-based resin, an epoxy-based resin, a silicone-based resin, or the like, or a film made of an ultraviolet-curable resin. A thickness of such a transparent optical film may be appropriately determined, but in general, the thickness of the transparent optical film may be determined to be in a range of 1 to 500 µm in consideration of strength, workability such as handling property, thin layer property, and the like. Specifically, the thickness of the transparent optical film is preferably in a range of 1 to 300 µm, and more preferably, in a range of 5 to 200 µm.

The base film 100 may contain one or more appropriate additives. For example, the additives may include an ultraviolet absorber, an antioxidant, a lubricant, a plasticizer, a release agent, a coloring inhibitor, a flame retardant, a nucleating agent, an antistatic agent, a pigment, a colorant, and the like. The base film 100 may have a structure including various functional layers such as a hard coating layer, an antireflective layer, a gas barrier layer, and the like on one surface or both surfaces of the film, and the functional layers are not limited to those described above and may include various functional layers according to the application.

Further, the transparent optical film may be surface-treated as necessary. The surface treatment may include a dry treatment such as a plasma treatment, a corona treatment, a primer treatment, or the like, a chemical treatment such as an alkali treatment including a saponification treatment, or the like.

Figure 2:
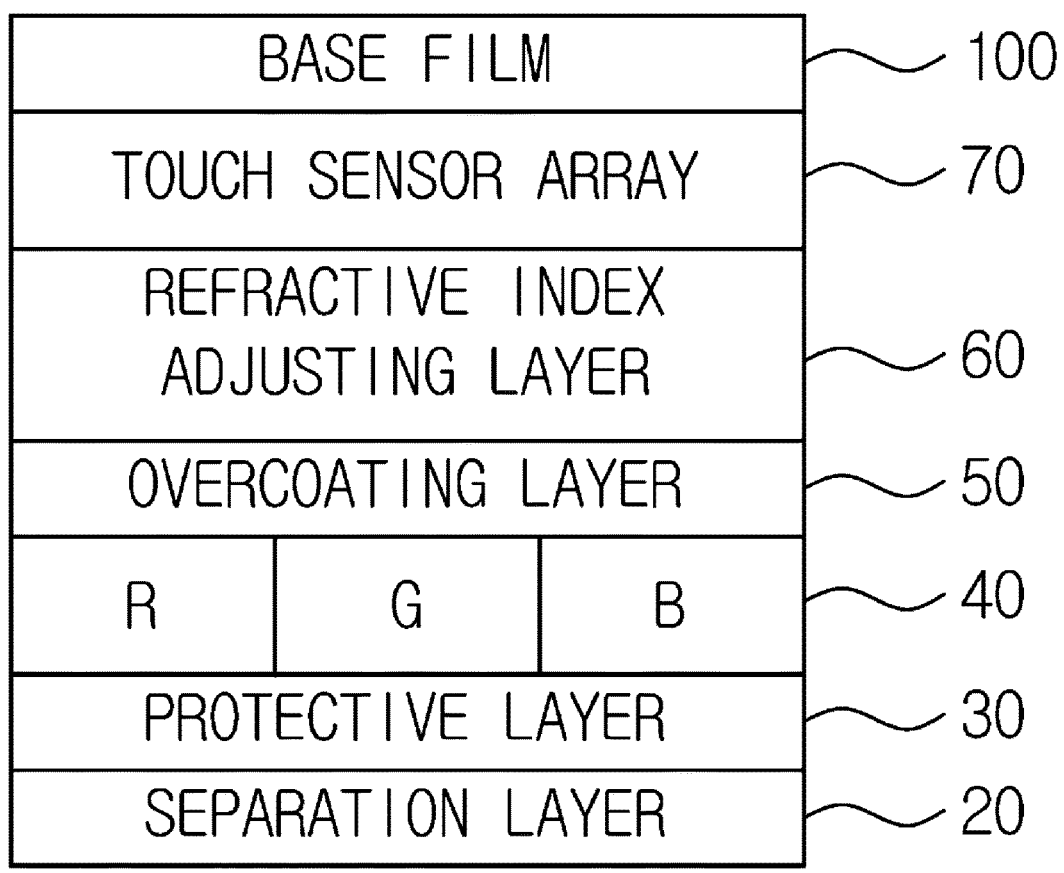
FIG. 2 is a view showing a flexible color filter integrated with a touch sensor according to a second embodiment of the present invention.

FIG. 2 is a view showing a flexible color filter integrated with a touch sensor according to a second embodiment of the present invention.

Referring to FIG. 2, the flexible color filter integrated with the touch sensor according to the second embodiment of the present invention includes a separation layer 20, a protective layer 30, a color filter array 40, an overcoating layer 50, a refractive index adjusting layer 60, a touch sensor array 70, and a base film 100.

A difference between the first embodiment and the second embodiment is that positions at which the base films 100 are bonded are different.

According to the first embodiment, the base film 100 is bonded to the other surface of the separation layer 20. Conversely, according to the second embodiment, the base film 100 is bonded to the touch sensor array 70.

Excluding such a difference, a configuration of the second embodiment is the same as that of the first embodiment, and thus a description thereof will not be repeated.

Figure 3:
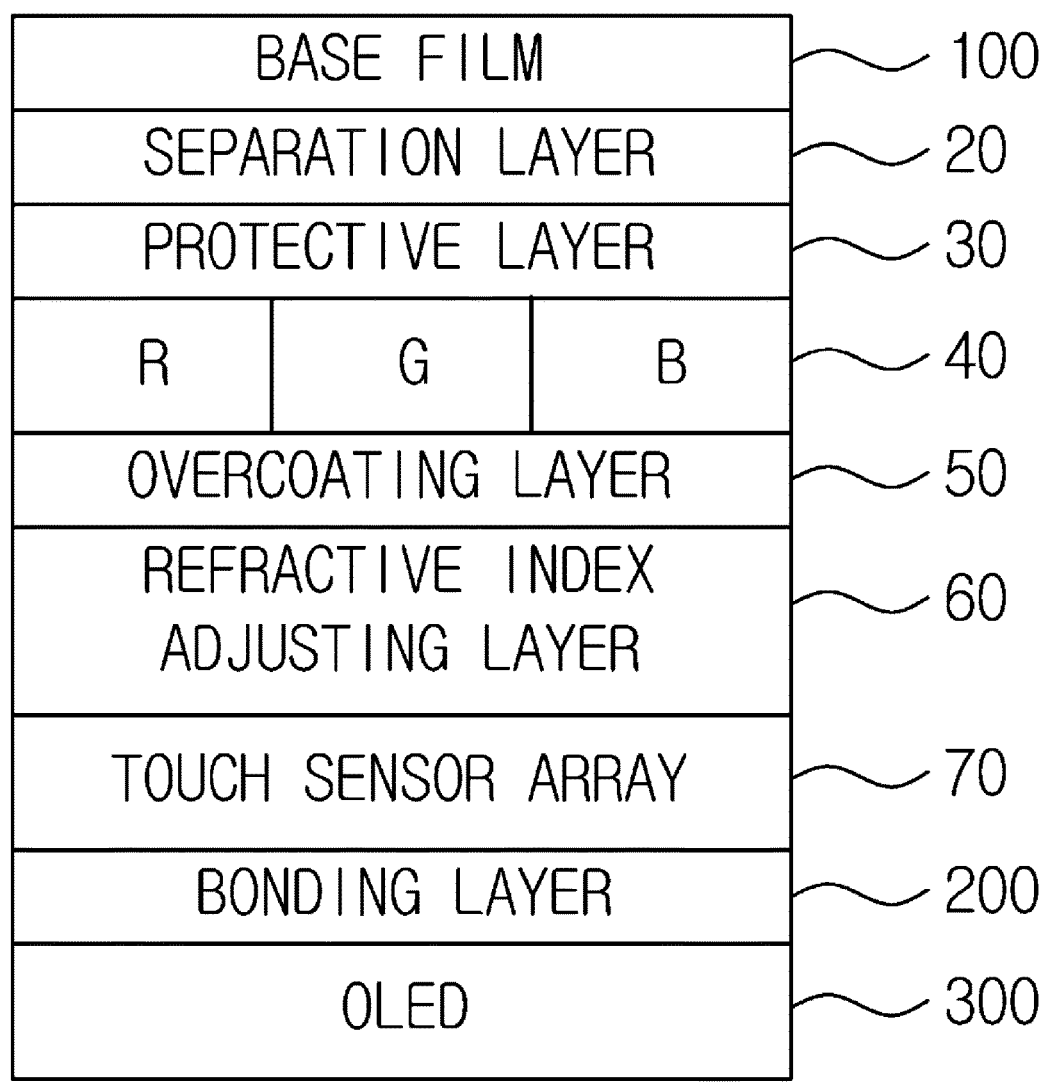
FIG. 3 is a view showing a flexible organic light-emitting display including the flexible color filter integrated with the touch sensor according to the first embodiment of the present invention.

FIG. 3 is a view showing a flexible organic light-emitting display including the flexible color filter integrated with the touch sensor according to the first embodiment of the present invention.

Referring to FIG. 3, the flexible organic light-emitting display including the flexible color filter integrated with the touch sensor according to the first embodiment of the present invention includes the separation layer 20, the protective layer 30, the color filter array 40, the overcoating layer 50, the refractive index adjusting layer 60, the touch sensor array 70, the base film 100, a bonding layer 200, and an organic light-emitting diode (OLED) 300.

The flexible organic light-emitting display according to the first embodiment of the present invention shown in FIG. 3 includes the flexible color filter integrated with the touch sensor according to the first embodiment of the present invention described above in detail, and a description thereof will not be repeated.

The OLED 300 is bonded to the touch sensor array 70 included in the flexible color filter integrated with the touch sensor according to the first embodiment of the present invention with the bonding layer 200 interposed therebetween.

That is, referring to the cross-sectional structure shown in FIG. 3, the flexible organic light-emitting display including the flexible color filter integrated with the touch sensor according to the first embodiment of the present invention has a structure in which the OLED 300, the touch sensor array 70, and the color filter array 40 are sequentially stacked.

Figure 4:
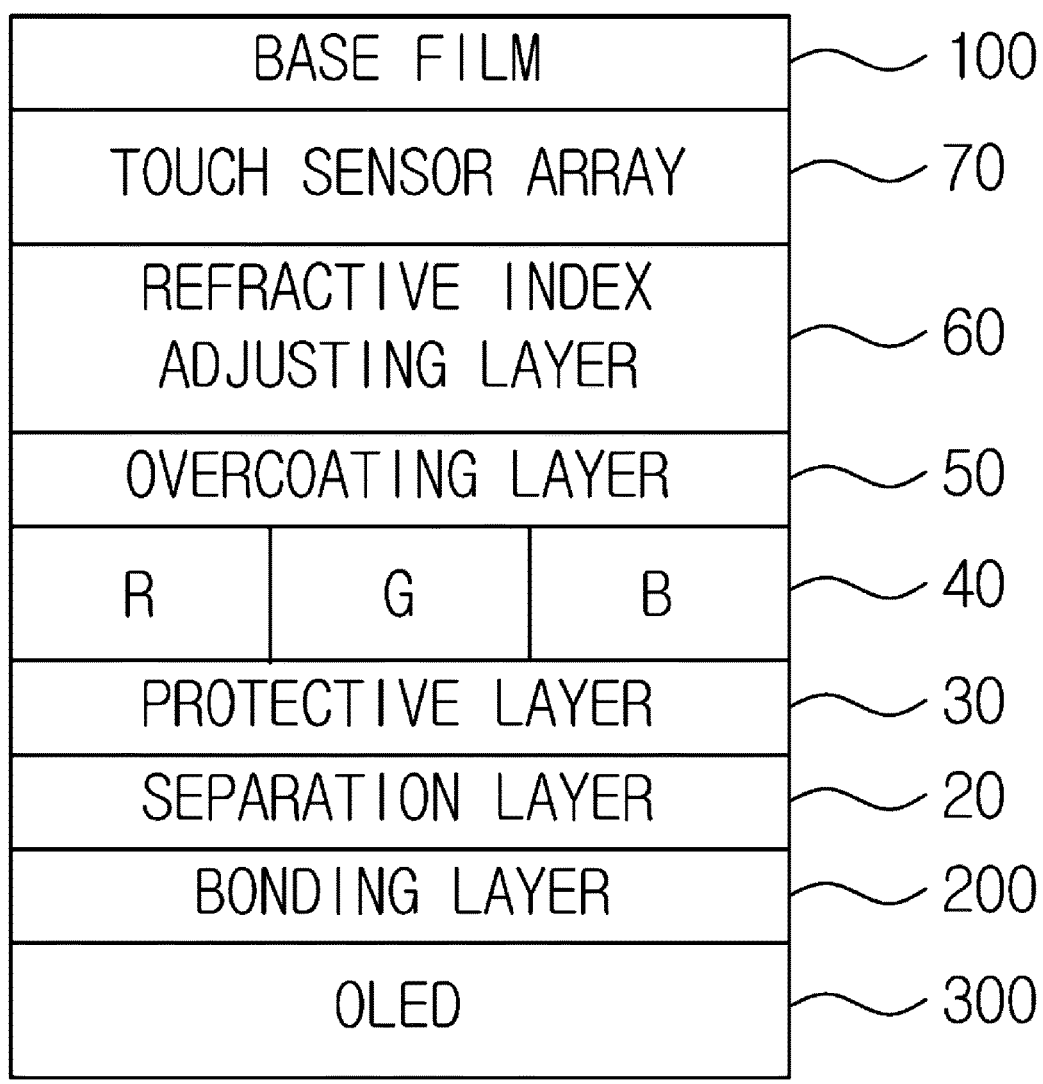
FIG. 4 is a view showing a flexible organic light-emitting display including the flexible color filter integrated with the touch sensor according to the second embodiment of the present invention.

FIG. 4 is a view showing a flexible organic light-emitting display including the flexible color filter integrated with the touch sensor according to the second embodiment of the present invention.

Referring to FIG. 4, the flexible organic light-emitting display including the flexible color filter integrated with the touch sensor according to the second embodiment of the present invention includes the separation layer 20, the protective layer 30, the color filter array 40, the overcoating layer 50, the refractive index adjusting layer 60, the touch sensor array 70, the base film 100, a bonding layer 200, and an OLED 300.

The flexible organic light-emitting display according to the second embodiment of the present invention shown in FIG. 4 includes the flexible color filter integrated with the touch sensor according to the second embodiment of the present invention described above in detail, and a description thereof will not be repeated.

The OLED 300 is bonded to the other surface of the separation layer 20 included in the flexible color filter integrated with the touch sensor according to the second embodiment of the present invention with the bonding layer 200 interposed therebetween.

That is, referring to the cross-sectional structure shown in FIG. 4, the flexible organic light-emitting display including the flexible color filter integrated with the touch sensor according to the second embodiment of the present invention has a structure in which the OLED 300, the color filter array 40, and the touch sensor array 70 are sequentially stacked.

Figure 5:
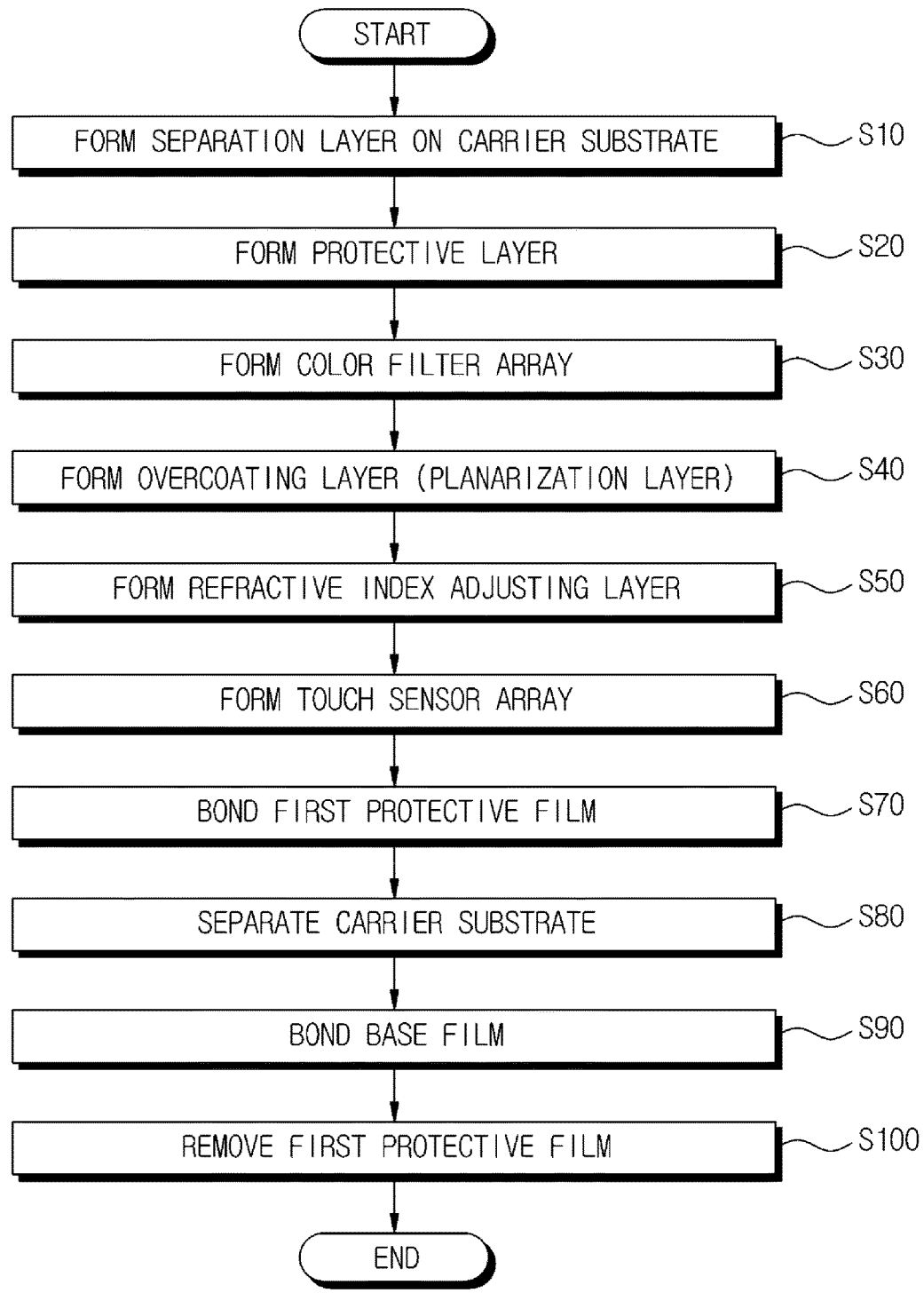
FIG. 5 is a process flowchart of a manufacturing method of the flexible color filter integrated with the touch sensor according to the first embodiment of the present invention.

FIG. 5 is a process flowchart of a manufacturing method of the flexible color filter integrated with the touch sensor according to the first embodiment of the present invention, and FIGS. 6 to 15 are process cross-sectional views of the manufacturing method of the flexible color filter integrated with the touch sensor according to the first embodiment of the present invention.

Figure 6:
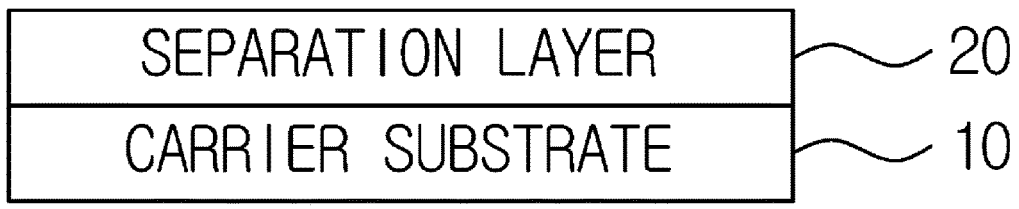
FIGS. 6 to 15 are process cross-sectional views of the manufacturing method of the flexible color filter integrated with the touch sensor according to the first embodiment of the present invention.

Referring to FIGS. 5 and 6, in operation S10, a process of forming the separation layer 20 on the carrier substrate 10 is performed.

The separation layer 20 is a layer for separating the color filter array 40 and the touch sensor array 70, which are formed on the carrier substrate 10, from the carrier substrate 10 using the below-described process. The separation layer 20 may surround and cover the color filter array 40 formed thereon and may function to insulate the color filter array 40 from the outside.

A material of the separation layer 20 is not particularly limited as long as the material satisfies conditions for providing a certain level of separation force and transparency. For example, the separation layer 20 may be formed of a polymer such as a polyimide-based polymer, a poly-vinyl-alcohol-based polymer, a polyamic-acid-based polymer, a polyamide-based polymer, a polyethylene-based polymer, a polystyrene-based polymer, a polynorbornene-based polymer, a phenylmaleimide-copolymer-based polymer, a polyazobenzene-based polymer, a polyphenylenephthalamide-based polymer, a polyester-based polymer, a polymethylmethacrylate-based polymer, a polyarylate-based polymer, a cinnamate-based polymer, a coumarin-based polymer, a phthalimidine-based polymer, a chalcone-based polymer, an aromatic-acetylene-based polymer, or the like, and one polymer of the above polymers may be used or two or more polymers may be mixed and used.

The separation force of the separation layer 20 is not particularly limited, but may be, for example, in a range of 0.01 N/25 mm to 1 N/25 mm, and preferably, in a range of 0.01 N/25 mm to 0.1 N/25 mm. When the separation force of the separation layer 20 satisfies the above range, the flexible color filter integrated with the touch sensor may be easily separated from the carrier substrate 10 without any residue, and curls and cracks due to a tensile force generated during the separation may be reduced, in the process of manufacturing the flexible color filter integrated with the touch sensor.

A thickness of the separation layer 20 is not particularly limited, but may be, for example, in a range of 10 to 1,000 nm, and preferably, 50 to 500 nm.

When the thickness of the separation layer 20 satisfies the above range, a pattern having a stable and uniform separation force may be formed.

For example, any material may be used as the carrier substrate 10 without limitation as long as the material can provide appropriate strength to be fixed without bending or twisting easily during the process and have very low influence on heat or chemical treatment. For example, glass, quartz, a silicon wafer, an SUS, or the like may be used as the material of the carrier substrate 10.

Figure 7:
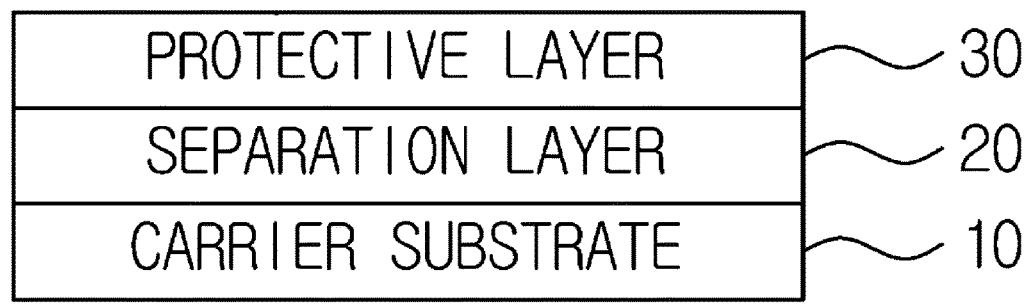

Referring to FIGS. 5 and 7, in operation S20, a process of forming the protective layer 30 on the separation layer 20 is performed.

The protective layer 30 is an optional component that can be omitted as necessary. The protective layer 30 prevents damage on the separation layer 20 by being exposed to a process chemical such as a PR solvent for a color filter used for forming the color filter array 40, a developing solution, a cleaning solution used in the process, or the like during the process of manufacturing the flexible color filter integrated with the touch sensor according to the first embodiment of the present invention.

Any polymer known in the art may be used as a material of the protective layer 30 without limitation, and for example, an organic insulating film may be applied to the protective layer 30. The protective layer 30 may be formed of a curable composition containing a polyol and a melamine curing agent among the polymers, but the present invention is not limited thereto.

Specific examples of the polyol include polyether glycol derivatives, polyester glycol derivatives, polycaprolactone glycol derivatives, and the like, but the present invention is not limited thereto.

Specific examples of the melamine curing agent include methoxy methyl melamine derivatives, methyl melamine derivatives, butyl melamine derivatives, isobutoxy melamine derivatives, butoxy melamine derivatives, and the like, but the present invention is not limited thereto.

As another example, the protective layer 30 may be formed of an organic-inorganic hybrid curable composition, and when an organic compound and an inorganic compound are used at the same time, cracks generated during the separation may be preferably reduced.

The above-described components may be used as the organic compound, and silica-based nanoparticles, silicon-based nanoparticles, glass nanofibers, or the like may be used as the inorganic compound, but the present invention is not limited thereto.

Figure 8:
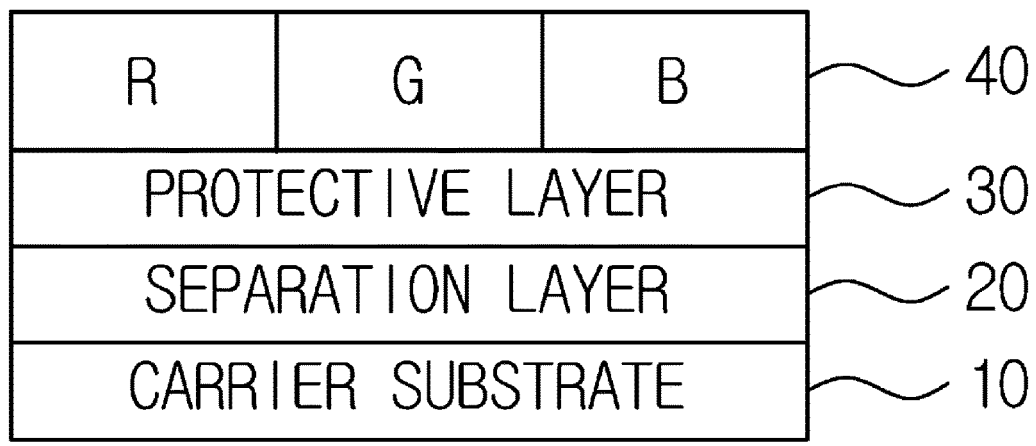

Referring to FIGS. 5 and 8, in operation S30, a process of forming the color filter array 40 on the protective layer 30 is performed.

The color filter array 40 functions to reduce an external light reflectance and improve the color reproducibility of the display. The protective layer 30 is a component that can be omitted, and when the protective layer 30 is omitted, the color filter array 40 is formed on one surface of the separation layer 20.

For example, the color filter array 40 may be formed in any conventional manner and components of the color filter array 40 may include a black matrix (BM), and blue (B), green (G), and red (R) pixels.

For example, the BM may be formed to be located on the same optical path as a pixel definition layer (PDL) of an OLED or a bank between pixels, and the B, G, and R pixels may be formed to overlap some regions of the BM.

Figure 9:
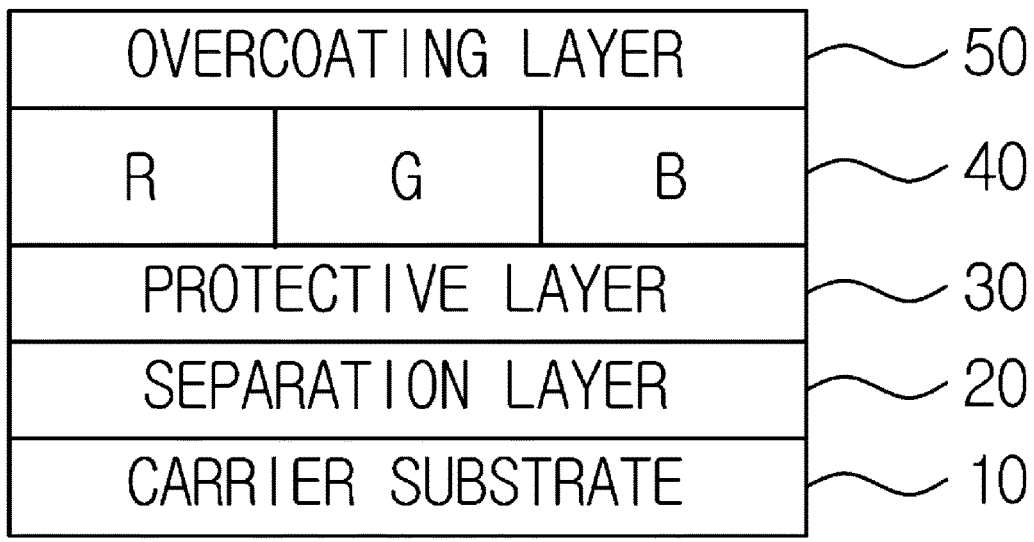

Referring to FIGS. 5 and 9, in operation S40, a process of forming the overcoating layer 50 on the color filter array 40 is performed.

The overcoating layer 50 performs a function of planarization. Specifically, the overcoating layer 50 prevents a phenomenon in which pixels constituting the color filter array 40 are deformed due to a step that can be generated by electrode patterns constituting the touch sensor array 70 and color sense is distorted. For example, a thickness of the overcoating layer 50 is preferably about 2 μm or more, and an organic insulating material may be applied as a constituent material of the overcoating layer 50.

Further, the overcoating layer 50 functions to protect the components during a subsequent etching process. Specifically, when the overcoating layer 50 is formed on the color filter array 40 and sensing electrode patterns constituting the touch sensor array 70 are then formed by chemical etching or the like, the components including the color filter array 40 may be protected because the overcoating layer 50 prevents the color filter array 40 from being exposed to an etching solution.

Figure 10:
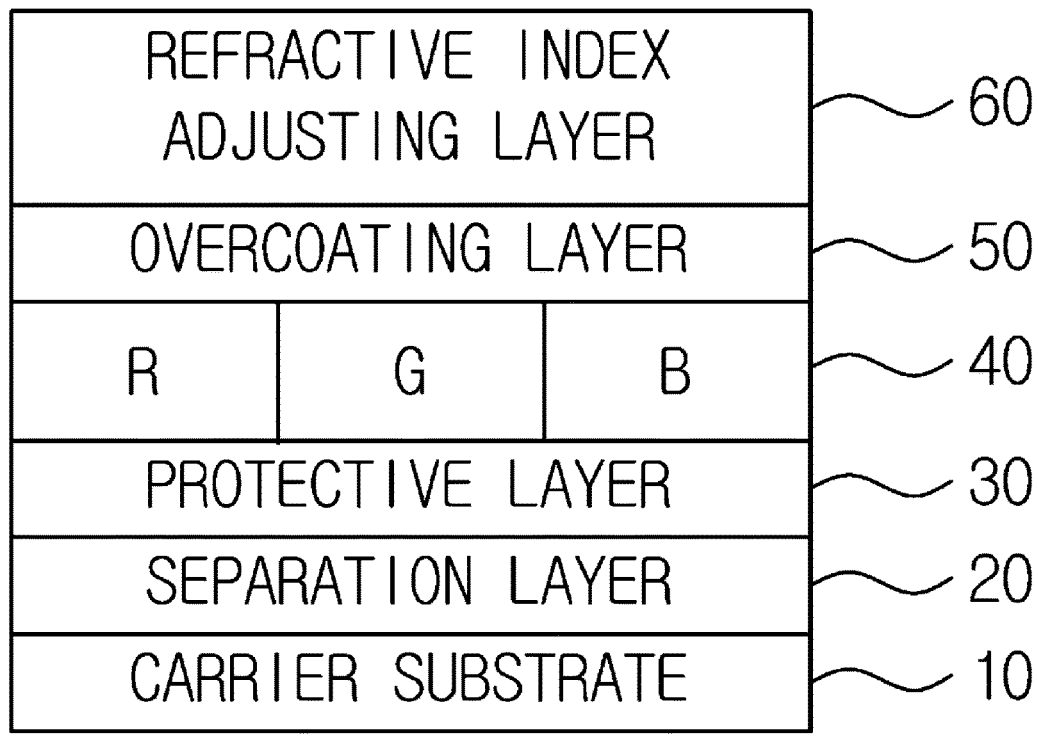

Referring to FIGS. 5 and 10, in operation S50, a process of forming the refractive index adjusting layer 60 on the overcoating layer 50 is performed.

Although the refractive index adjusting layer 60 is shown as being formed on the overcoating layer 50 in the drawing, this is only one example, and the refractive index adjusting layer 60 may be formed at an arbitrary position between the color filter array 40 and the touch sensor array 70.

The refractive index adjusting layer 60 functions to improve optical properties such as light transmittance and the like by compensating for a refractive index difference between functional layers constituting the flexible color filter integrated with the touch sensor according to the first embodiment of the present invention.

For example, the refractive index adjusting layer 60 may be formed of a material having a high refractive index, and may have a refractive index of 1.50 to 1.87 and a thickness of 30 nm to 2,000 nm.

For example, the refractive index adjusting layer 60 may be a single film or a multilayer film, and may be formed by a deposition process or a wet coating process in consideration of upper and lower refractive indexes.

For example, the refractive index adjusting layer 60 may include an inorganic insulating film. As a specific example, the refractive index adjusting layer 60 may include one or more selected from the group consisting of $Al_2O_3$, MgO, $NdF_3$, SiON, $Y_2O_3$, ZnO, $TiO_2$, $ZrO_2$, and $Nb_2O_5$.

As another example, the refractive index adjusting layer 60 may include an organic insulating film. As a specific example, the refractive index adjusting layer 60 may include an organic matter containing inorganic fine particles.

When the refractive index adjusting layer 60 includes the organic matter containing the inorganic fine particles, the organic matter may include at least one selected from the group consisting of an acrylic resin, a urethane resin, a melamine resin, an alkyd resin, a siloxane-based polymer, and an organic silane condensate, but the present invention is not limited thereto.

When the refractive index adjusting layer 60 includes the organic matter containing the inorganic fine particles, the inorganic fine particles may include on or more selected from the group consisting of $Al_2O_3$, MgO, $NdF_3$, SiON, $Y_2O_3$, ZnO, $TiO_2$, $ZrO_2$, and $Nb_2O_5$, but the present invention is not limited thereto.

When the refractive index adjusting layer 60 includes the organic matter containing the inorganic fine particles, a refractive index of the refractive index adjusting layer 60 may be adjusted, for example, by adjusting a content of the inorganic fine particles. For example, the refractive index of the refractive index adjusting layer 60 may be increased by increasing the content of the inorganic fine particles, and conversely, the refractive index of the refractive index adjusting layer 60 may be lowered by reducing the content of the inorganic fine particles.

Figure 11:
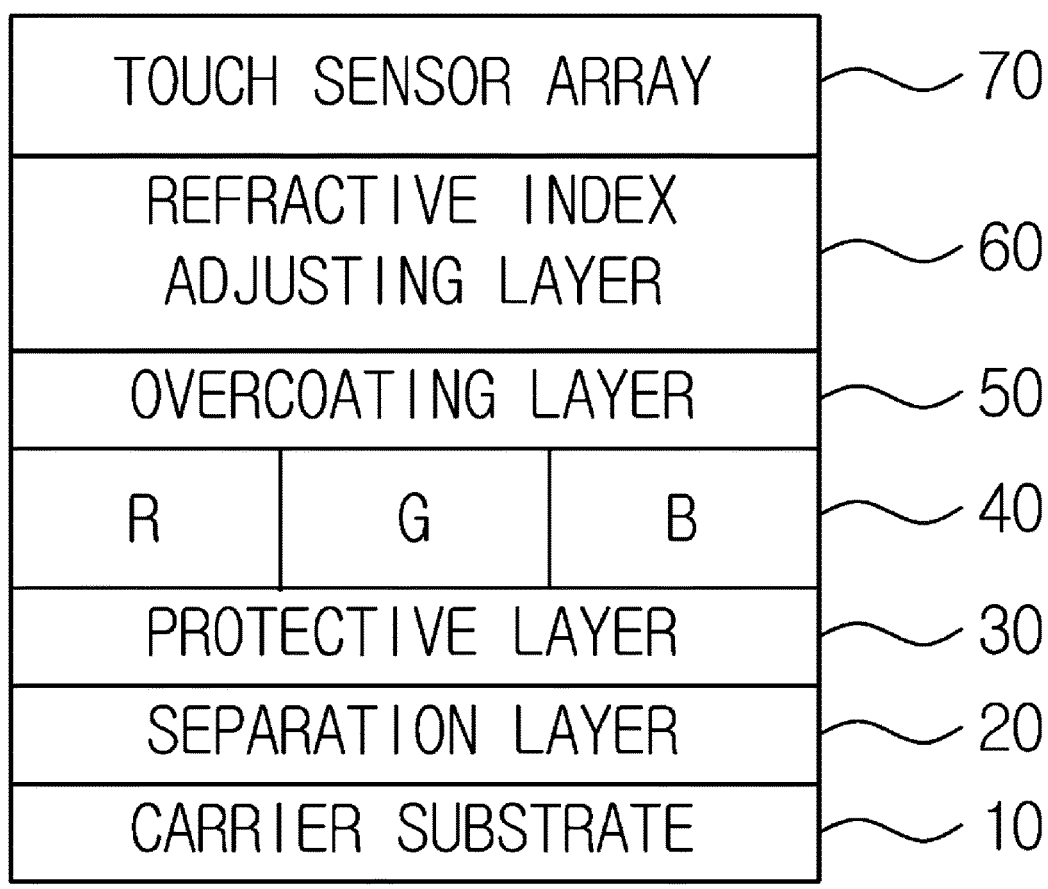

Referring to FIGS. 5 and 11, in operation S60, a process of forming the touch sensor array 70 on the refractive index adjusting layer 60 is performed.

When the refractive index adjusting layer 60 is omitted, the touch sensor array 70 is formed on the overcoating layer 50.

The touch sensor array 70 is a component for sensing a touch signal input by a user.

For example, the sensing electrode patterns constituting the touch sensor array 70 may be formed to have an appropriate shape according to requirements of electronic devices desired to be used. For example, the touch sensor array 70 may include an electrode pattern for sensing an x coordinate and an electrode pattern for sensing a y coordinate, but the present invention is not limited thereto.

Any transparent conductive material may be used as the sensing electrode patterns constituting the touch sensor array 70 without limitation. For example, the sensing electrode patterns constituting the touch sensor array 70 may be formed of a material selected from among a metal oxide selected from the group consisting of indium tin oxide (ITO), indium zinc oxide (IZO), indium zinc tin oxide (IZTO), aluminum zinc oxide (AZO), gallium zinc oxide (GZO), florine tin oxide (FTO), indium tin oxide-silver-indium tin oxide (ITO-Ag-ITO), indium zinc oxide-silver-indium zinc oxide (IZO-Ag-IZO), indium zinc tin oxide-silver-indium zinc tin oxide (IZTO-Ag-IZTO), and aluminum zinc oxide-silver-aluminum zinc oxide (AZO-Ag-AZO), a metal selected from the group consisting of gold (Au), silver (Ag), copper (Cu), molybdenum (Mo), and APC, a nanowire formed of a metal selected from the group consisting of gold, silver, copper, and lead, a carbon-based material selected from the group consisting of CNT and graphene, and a conductive polymer material selected from the group consisting of poly(3,4-ethylenedioxythiophene)

(PEDOT) and polyaniline (PANI). One polymer of the above transparent conductive material may be used or two or more polymers may be mixed and used, and preferably, indium tin oxide may be used. Both crystalline and amorphous indium tin oxides are available to be used.

A thickness of the touch sensor array 70 is not particularly limited, but the thickness of the touch sensor array 70 is preferably as thin as possible in consideration of the flexibility of the touch sensor.

For example, the sensing electrode patterns constituting the touch sensor array 70 may be polygonal patterns having a triangular shape, a tetragonal shape, a pentagonal shape, a hexagonal shape, or a heptagonal shape, or the like, independently of each other.

For example, the touch sensor array 70 may include a regular pattern. The regular pattern means that the pattern shape has regularity. For example, the sensing electrode patterns may include patterns having a mesh shape such as a rectangular shape or a square shape, or having a shape such as a hexagonal shape, independently of each other.

Further, for example, the touch sensor array 70 may include an irregular pattern. The irregular pattern means that the pattern shape does not have regularity.

Further, for example, when the sensing electrode patterns constituting the touch sensor array 70 are formed of a material such as a metal nanowire, a carbon-based material, a polymeric material, or the like, the sensing electrode patterns may have a net structure. When the sensing electrode patterns have a net structure, signals are sequentially transmitted to adjacent patterns in contact with each other, so that a pattern having high sensitivity may be realized.

For example, the sensing electrode patterns constituting the touch sensor array 70 may be formed as a single layer or a plurality of layers.

Figure 12:
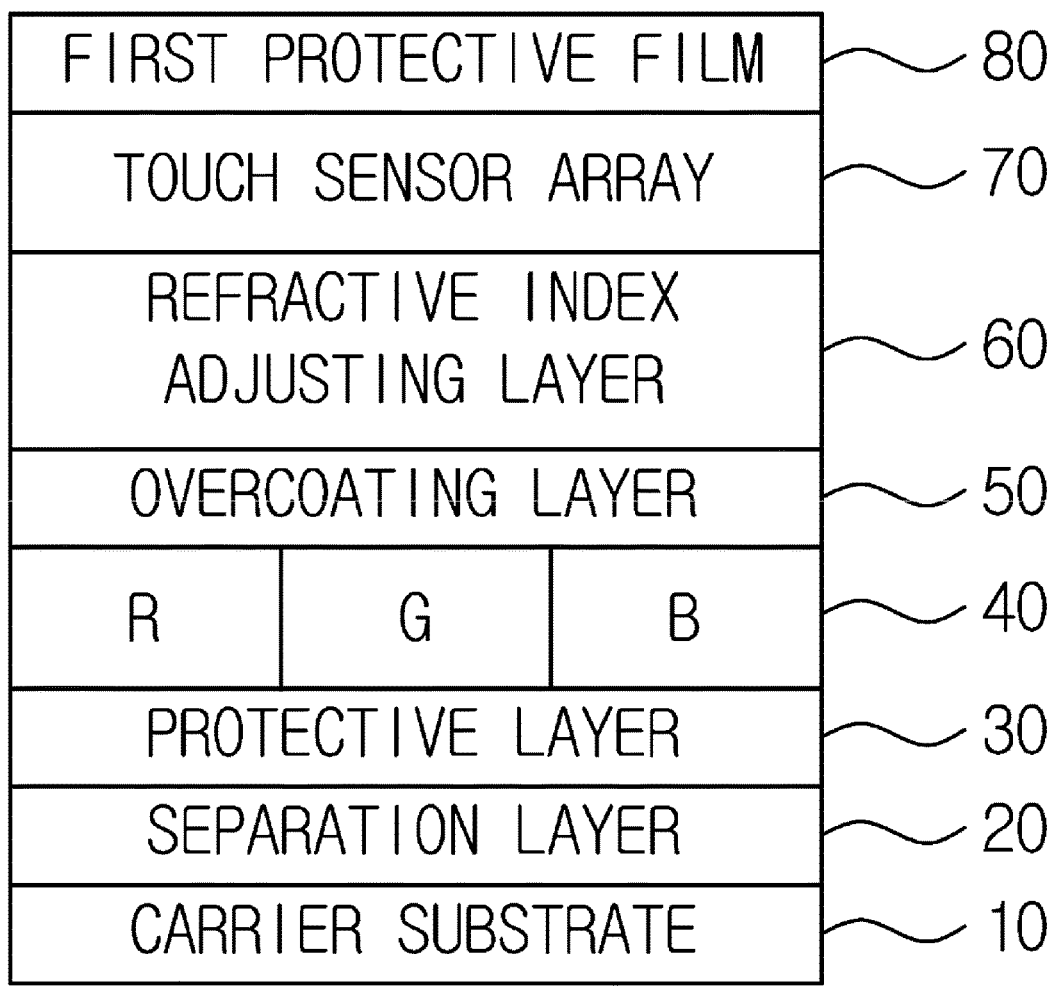

Referring to FIGS. 5 and 12, in operation S70, a process of bonding a first protective film 80 to the touch sensor array 70 is performed.

The first protective film 80 functions to protect the touch sensor array 70 during a process including a separating process of the carrier substrate 10, which will be described below.

Figure 13:
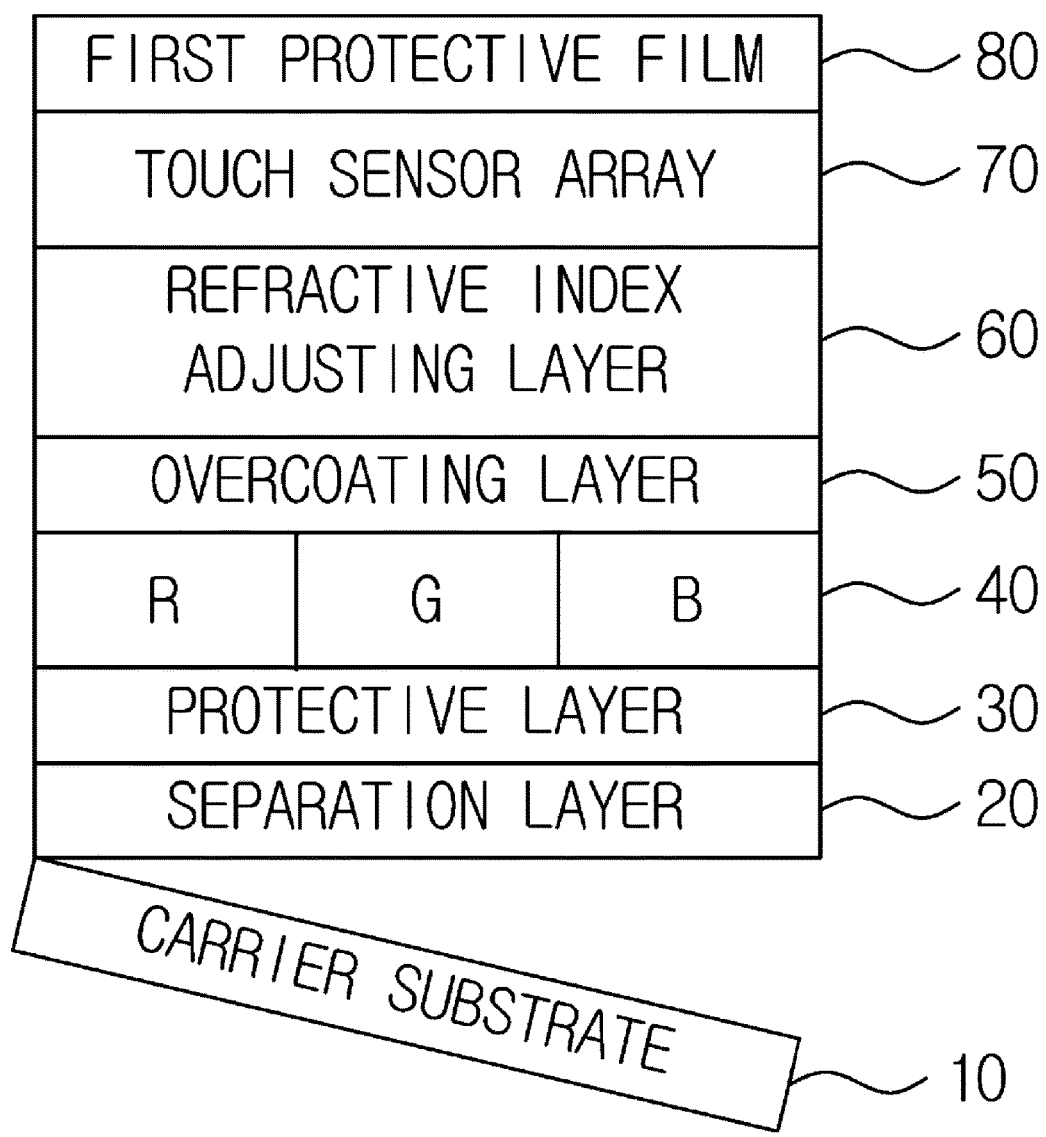

Referring to FIGS. 5 and 13, in operation S80, a process of separating the carrier substrate 10 from the separation layer 20 to expose the other surface of the separation layer 20 is performed.

For example, the carrier substrate 10 may be separated from the separation layer 20 by a delamination method using a roll-to-roll process, but a specific method for separating the carrier substrate 10 is not limited thereto.

Figure 14:
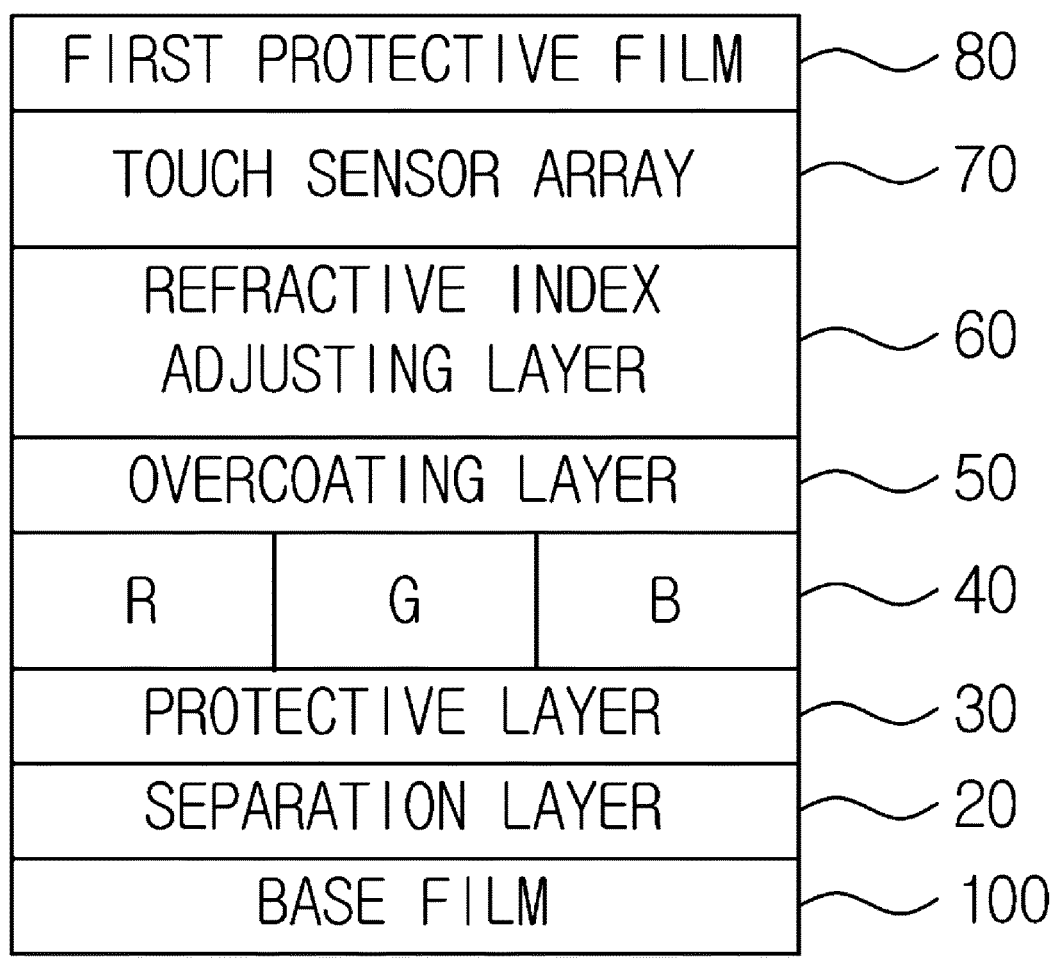

Referring to FIGS. 5 and 14, in operation S90, a process of bonding the base film 100 to the other surface of the separation layer 20 is performed.

For example, a film having a transparency of 80% or more at a level commonly used in the art and having high mechanical strength or high thermal stability may be used as the base film 100, but the present invention is not limited thereto.

As a specific example, the base film 100 may include a film made of a thermoplastic resin which is a polyester-based resin, such as polyethylene terephthalate, polyethylene isophthalate, polyethylene naphthalate, polybutylene terephthalate, or the like, a cellulose-based resin such as diacetylcellulose, triacetylcellulose, or the like, a polycarbonate resin, an acrylic-based resin such as polymethyl (meth)acrylate, polyethyl(meth)acrylate, or the like, a styrene-based resin such as polystyrene, acrylonitrile-styrene copolymer, or the like, a polyolefin-based resin such as polyethylene, polypropylene, a polyolefin having a cyclo or norbornene structure, ethylene-propylene copolymers, or the like, a vinyl-chloride-based resin, an amide-based resin such as nylon, aromatic polyamide, or the like, an imide-based resin, a polyether-sulfone-based resin, a sulfone-based resin, a polyether-ether-ketone-based resin, a sulfide-polyphenylene-based resin, a vinyl-alcohol-based resin, a vinylidene-chloride-based resin, a vinyl-butyral-based resin, an allylate-based resin, a polyoxymethylene-based resin, an epoxy-based resin, or the like, and may include a film made of a blend of the thermoplastic resin. Further, the base film 100 may include a film made of a thermosetting resin such as a (meth)acrylic-based resin, a urethane-based resin, an acrylic-urethane-based resin, an epoxy-based resin, a silicone-based resin, or the like, or a film made of an ultraviolet-curable resin. A thickness of such a transparent optical film may be appropriately determined, but in general, the thickness of the transparent optical film may be determined to be in a range of 1 to 500 μm in consideration of strength, workability such as handling property, thin layer property, and the like. Specifically, the thickness of the transparent optical film is preferably in a range of 1 to 300 μm, and more preferably, in a range of 5 to 200 μm.

The base film 100 may contain one or more appropriate additives. For example, the additives may include an ultraviolet absorber, an antioxidant, a lubricant, a plasticizer, a release agent, a coloring inhibitor, a flame retardant, a nucleating agent, an antistatic agent, a pigment, a colorant, or the like. The base film 100 may have a structure including various functional layers such as a hard coating layer, an antireflective layer, a gas barrier layer, and the like on one surface or both surfaces of the film, and the functional layers are not limited to those described above and may include various functional layers according to the application.

Further, the transparent optical film may be surface-treated as necessary. The surface treatment may include a dry treatment such as a plasma treatment, a corona treatment, a primer treatment, and the like, a chemical treatment such as an alkali treatment including a saponification treatment, or the like.

Figure 15:
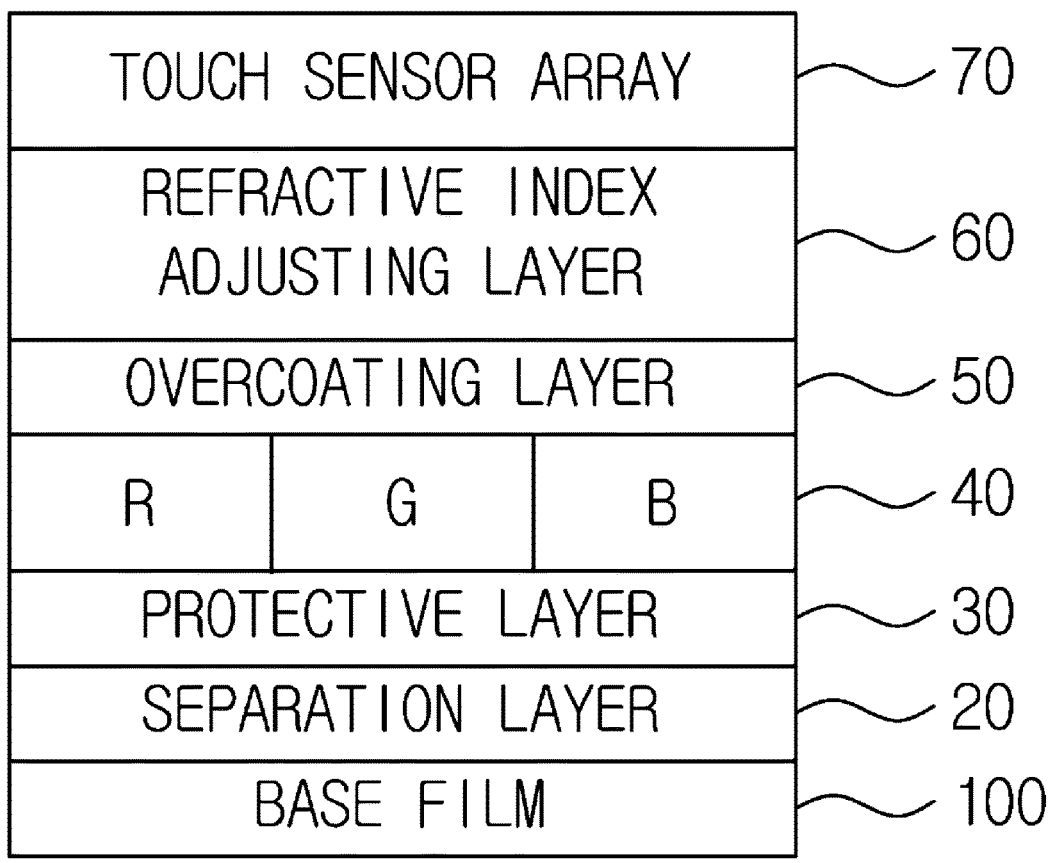

Referring to FIGS. 5 and 15, in operation S100, a process of separating and removing the first protective film 80, which is bonded to the touch sensor array 70, from the touch sensor array 70 is performed, and when the separating process is performed, the flexible color filter integrated with the touch sensor according to the first embodiment of the present invention is completed.

Figure 16:
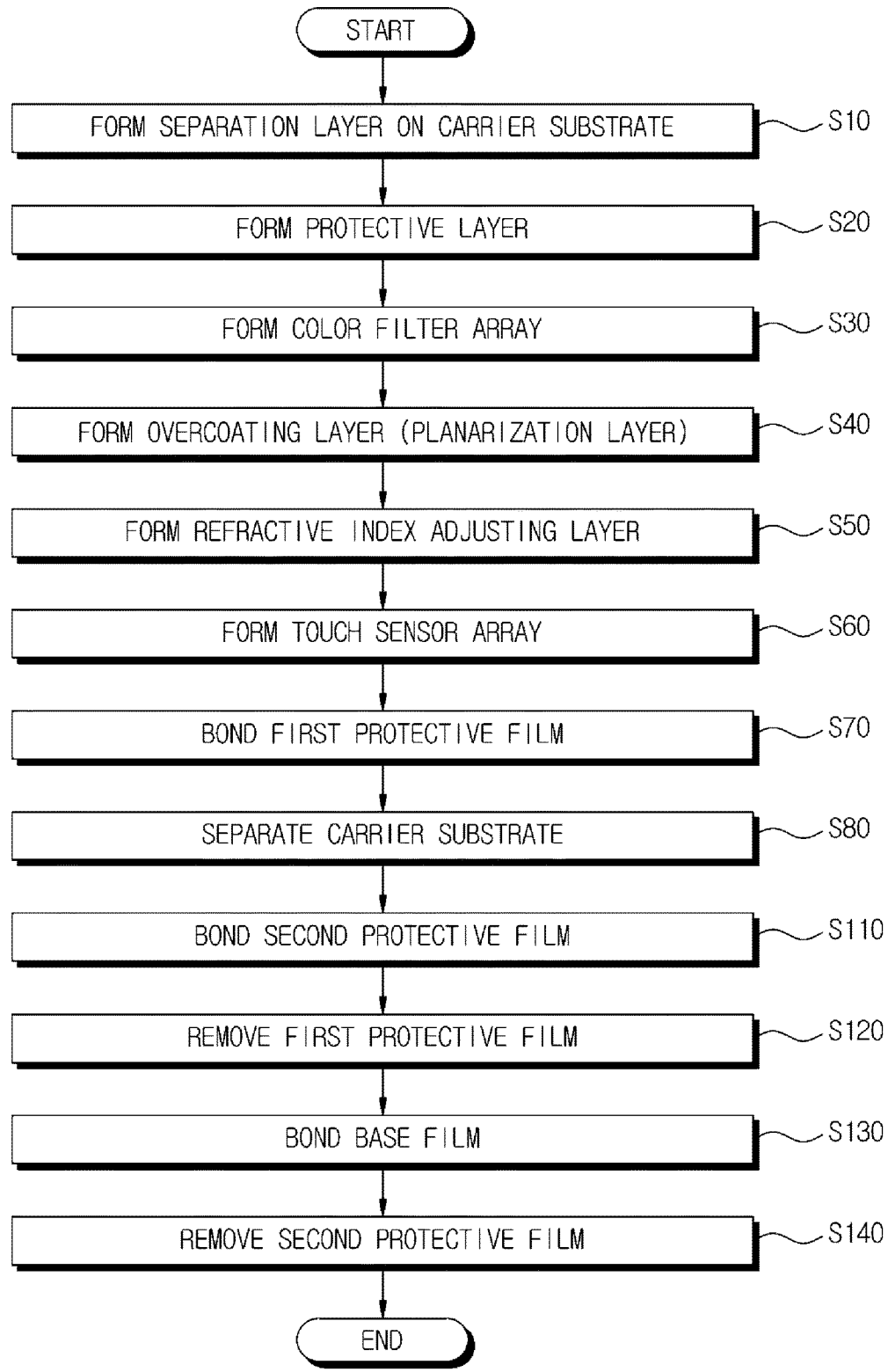
FIG. 16 is a process flowchart of a manufacturing method of the flexible color filter integrated with the touch sensor according to the second embodiment of the present invention.
Figure 17:
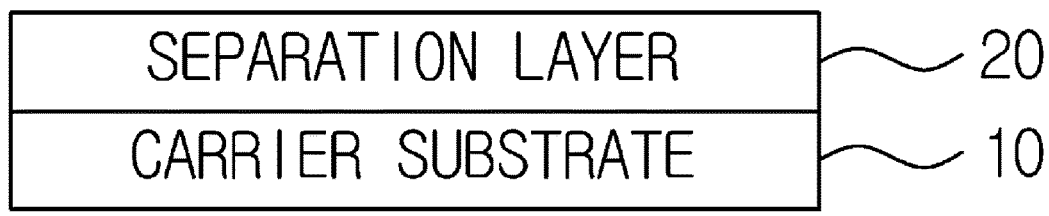
FIGS. 17 to 28 are process cross-sectional views of the manufacturing method of the flexible color filter integrated with the touch sensor according to the second embodiment of the present invention.
Figure 18:
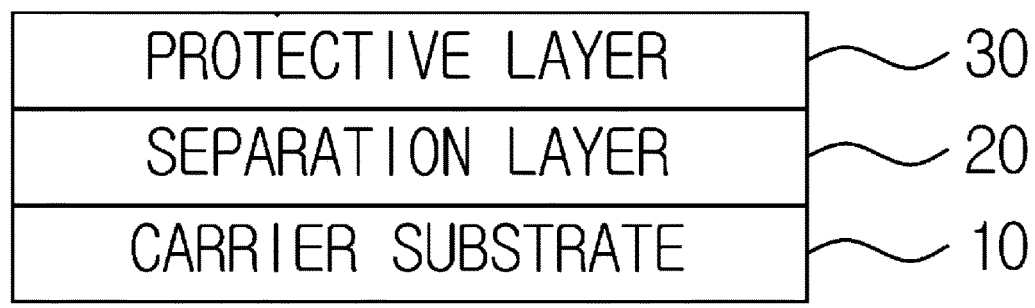
Figure 19:
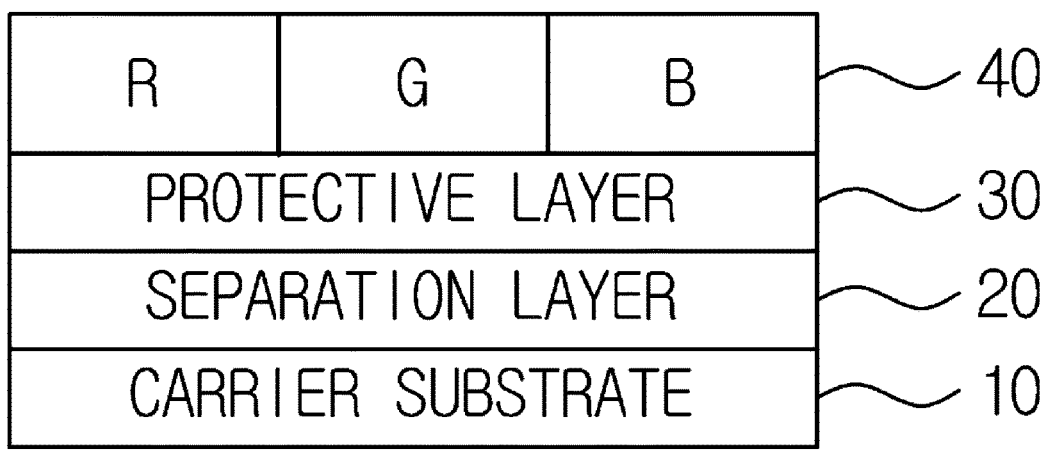
Figure 20:
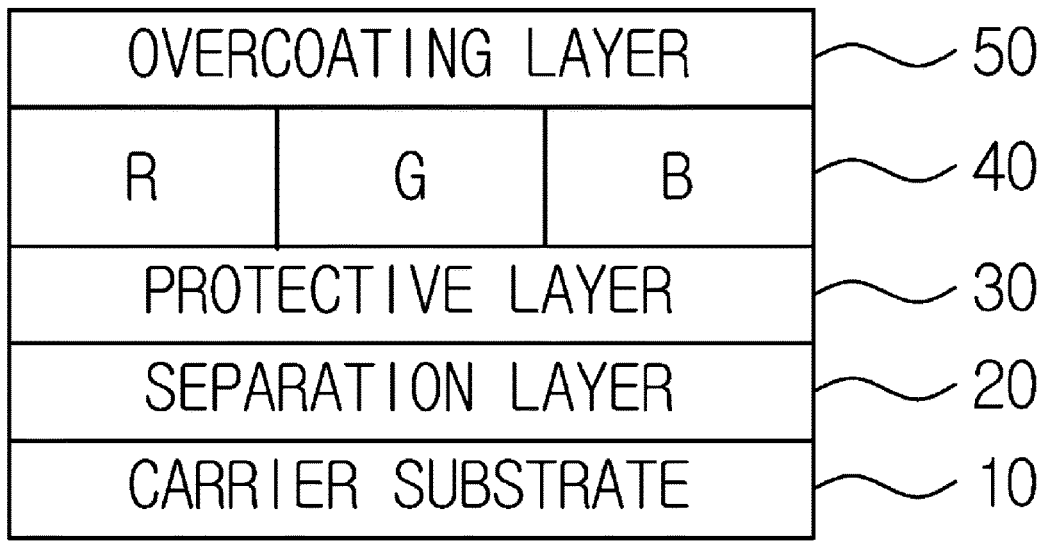
Figure 21:
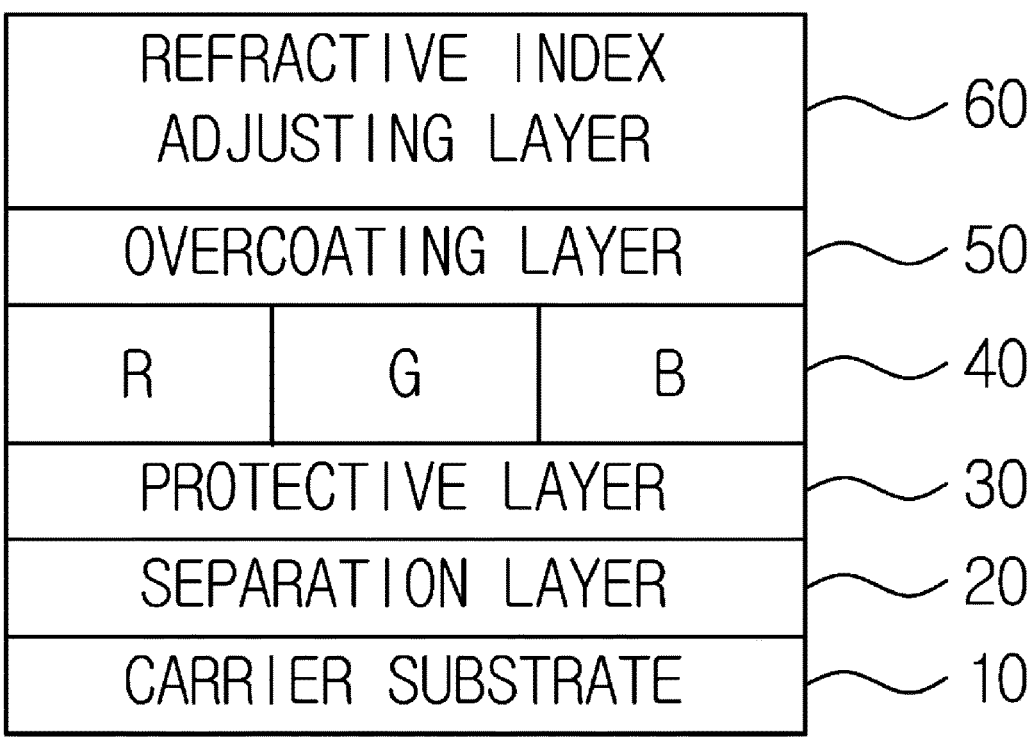
Figure 22:
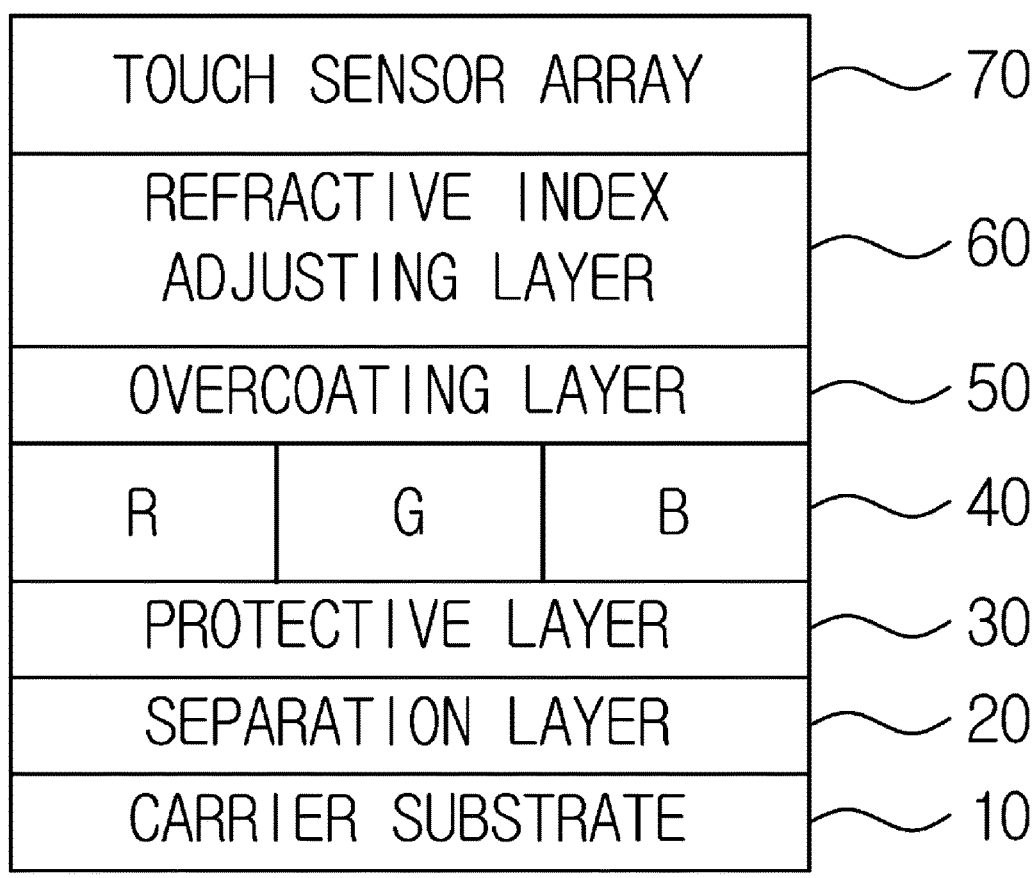
Figure 23:
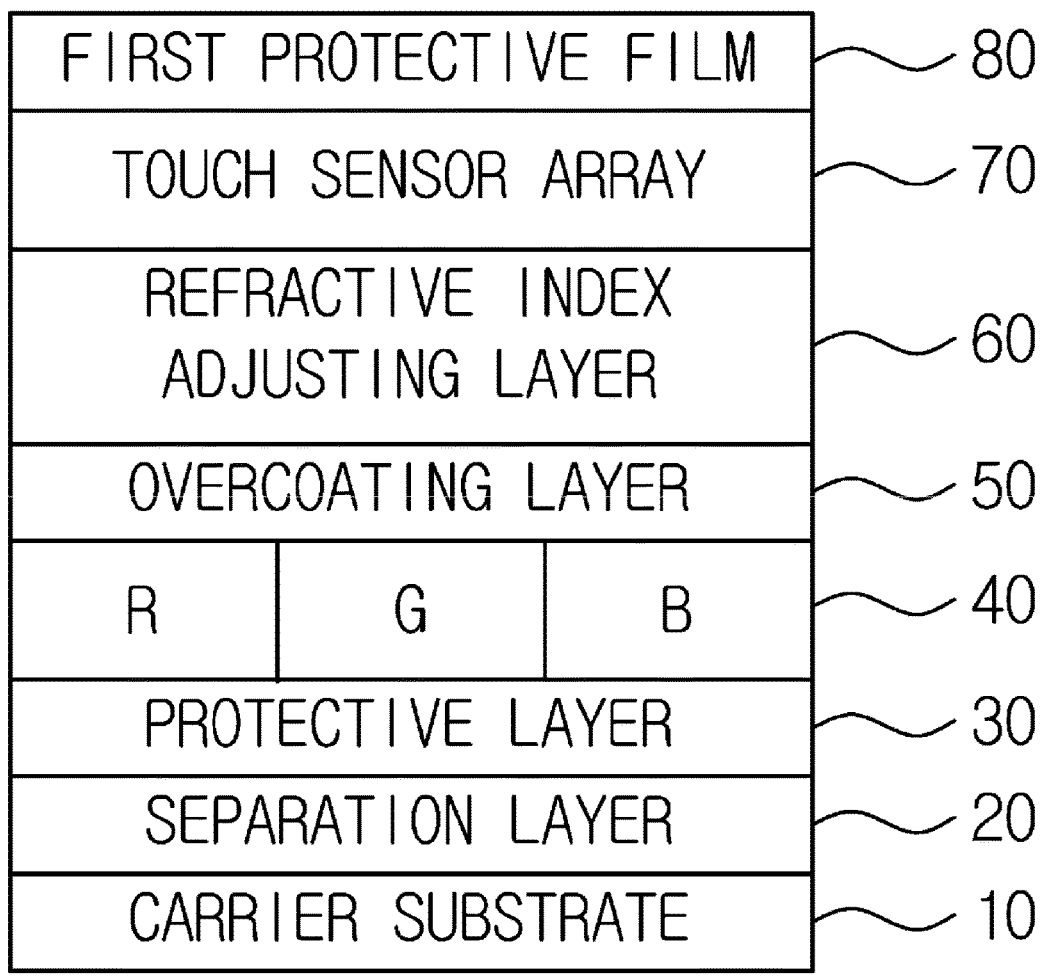
Figure 24:
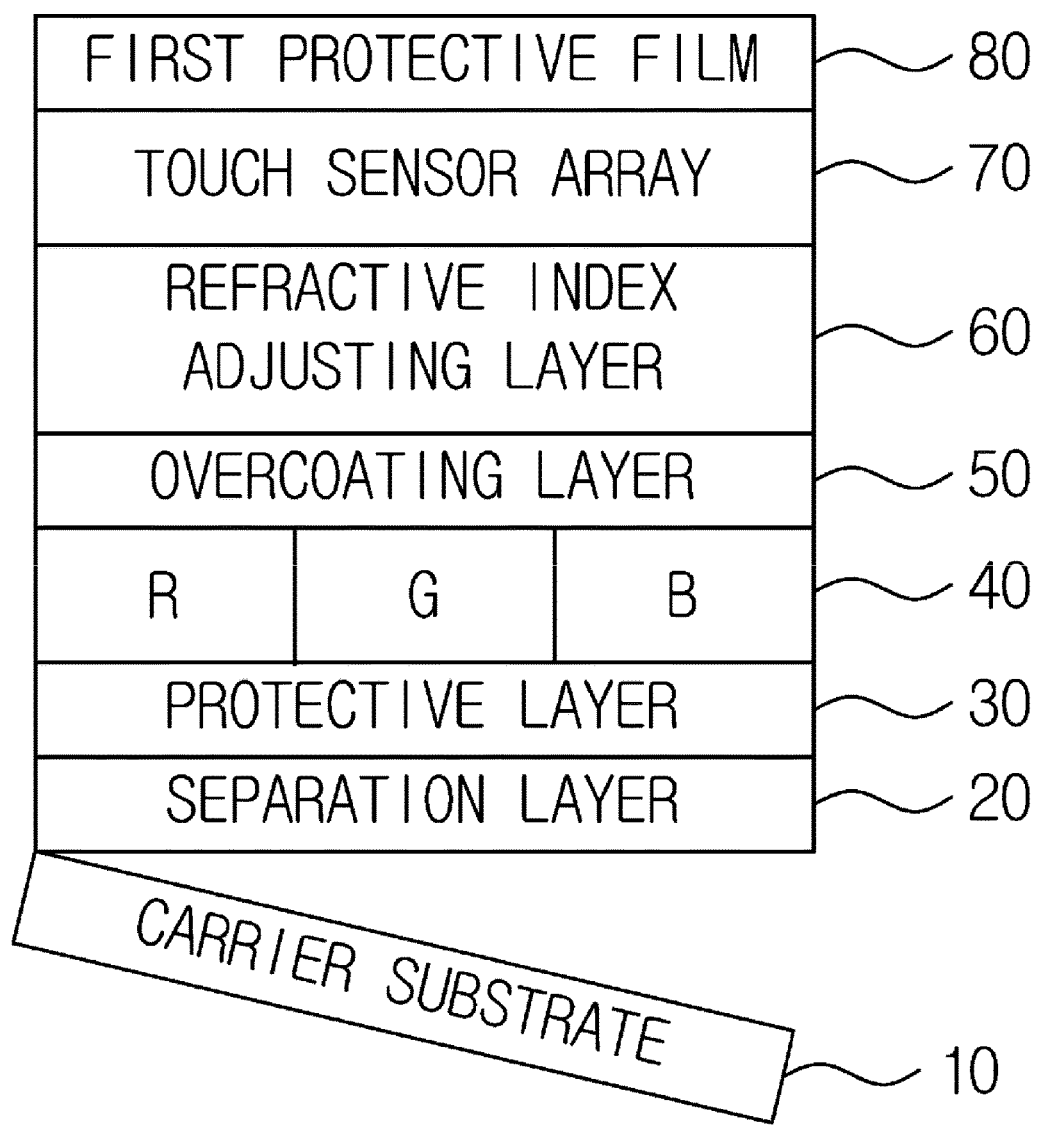

FIG. 16 is a process flowchart of a manufacturing method of the flexible color filter integrated with the touch sensor according to the second embodiment of the present invention, and FIGS. 17 to 28 are process cross-sectional views of the manufacturing method of the flexible color filter integrated with the touch sensor according to the second embodiment of the present invention.

Referring to FIGS. 16 to 28, among processes constituting the manufacturing method of the flexible color filter integrated with the touch sensor according to the second embodiment of the present invention, the processes in operations S10 to S80 are the same as those in the first embodiment, and thus descriptions of the processes will be omitted.

Figure 25:
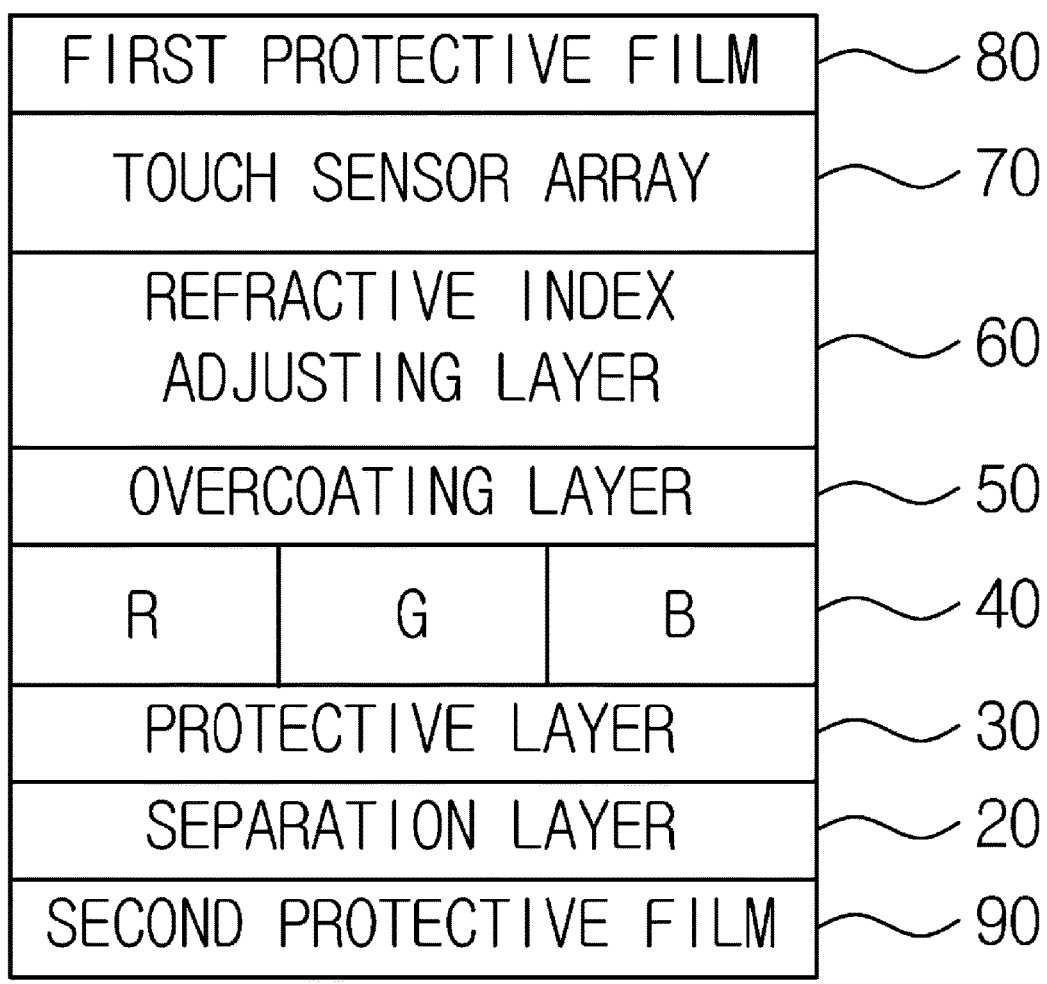

Referring to FIGS. 16 and 25, in operation S110, which is the first process different from that in the first embodiment, a process of bonding a second protective film 90 to the other surface of the separation layer 20, that is, to a surface of the separation layer 20 which is separated and exposed from the carrier substrate 10 among both surfaces of the separation layer 20, is performed.

Figure 26:
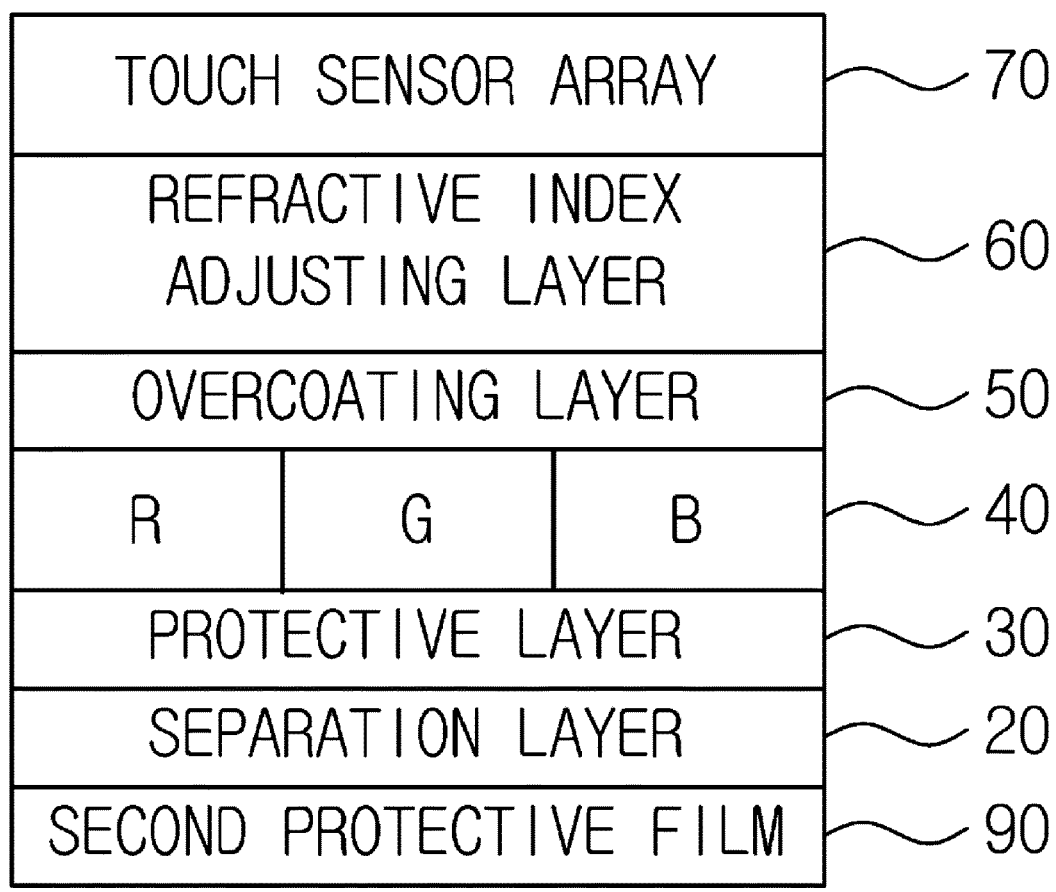

Referring to FIGS. 16 and 26, in operation S120, a process of exposing the touch sensor array 70 is performed by separating and removing the first protective film 80, which is bonded to the touch sensor array 70, from the touch sensor array 70.

Figure 27:
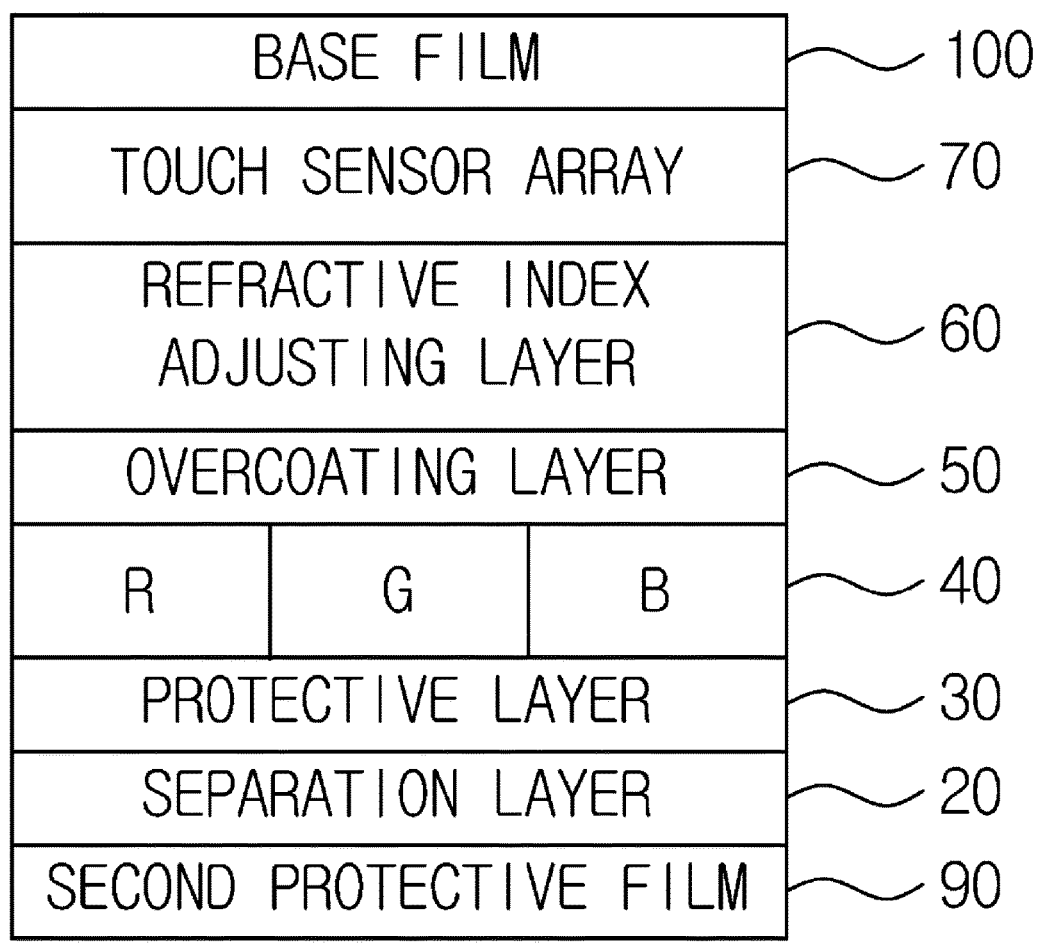

Referring to FIGS. 16 and 27, in operation S130, a process of bonding the base film 100 to the exposed surface of the touch sensor array 70 is performed. A material of the base film 100 according to the second embodiment is the same as that in the first embodiment, but bonding positions are different.

Figure 28:
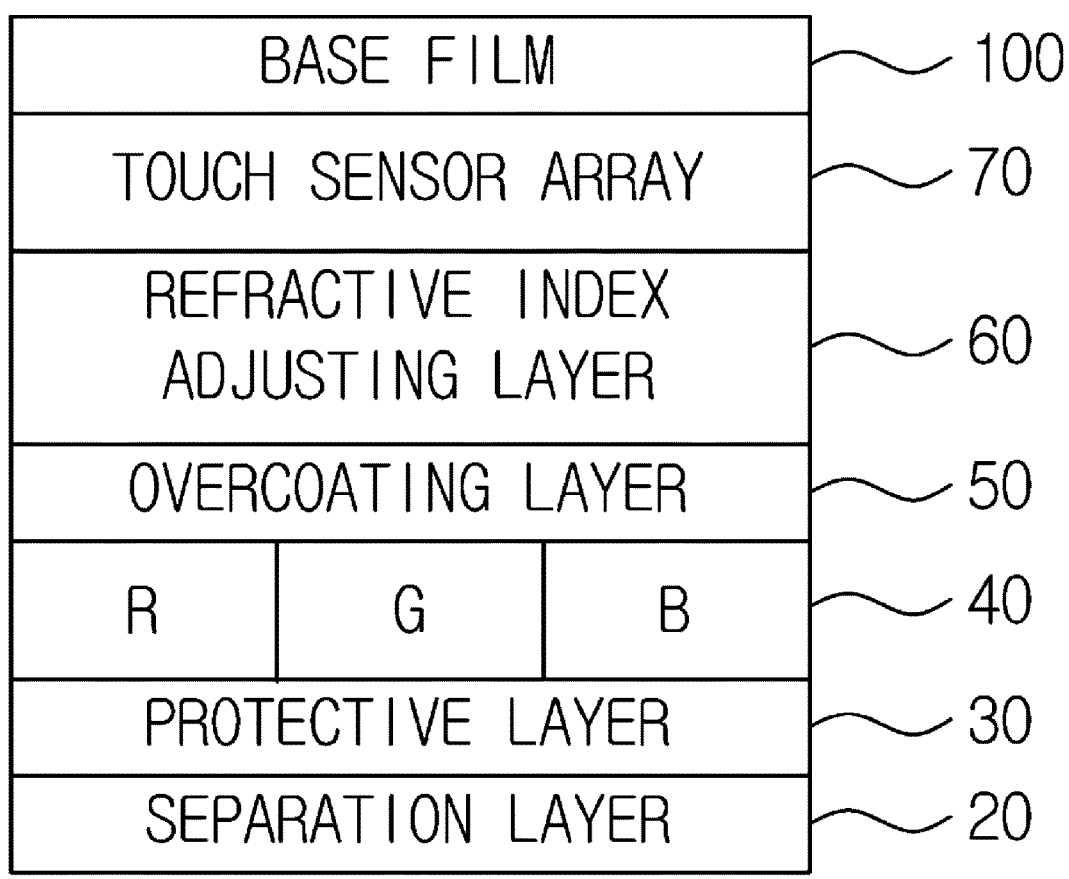

Referring to FIGS. 16 and 28, in operation S140, a process of exposing the other surface of the separation layer 20 is performed by separating and removing the second protective film 90, which is bonded to the other surface of the separation layer 20, from the other surface of the separation layer 20, and when the exposing process is performed, the flexible color filter integrated with the touch sensor according to the second embodiment of the present invention is completed.

Figure 29:
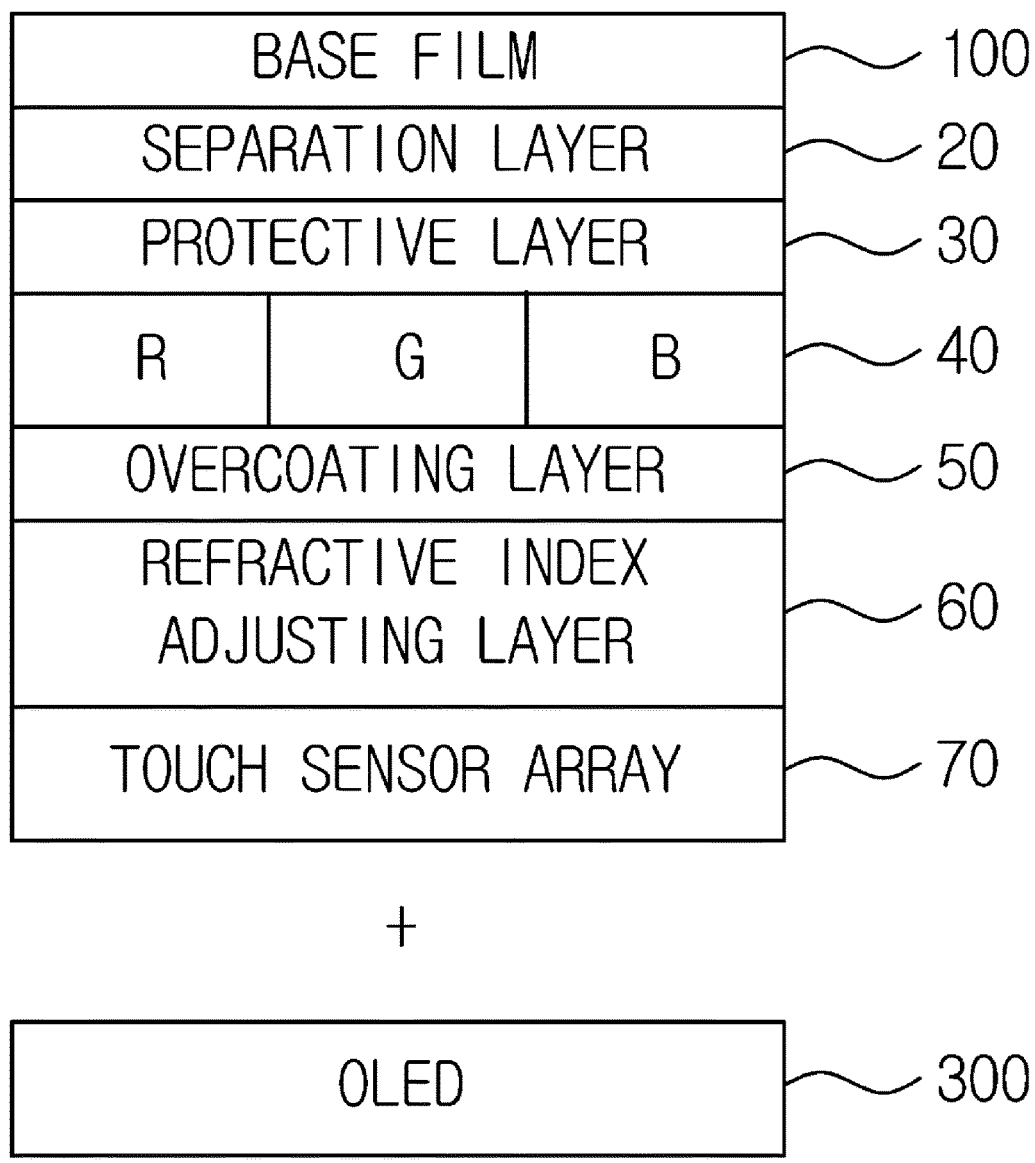
FIGS. 29 and 30 are process cross-sectional views of a manufacturing method of the flexible organic light-emitting display including the flexible color filter integrated with the touch sensor according to the first embodiment of the present invention.
Figure 30:
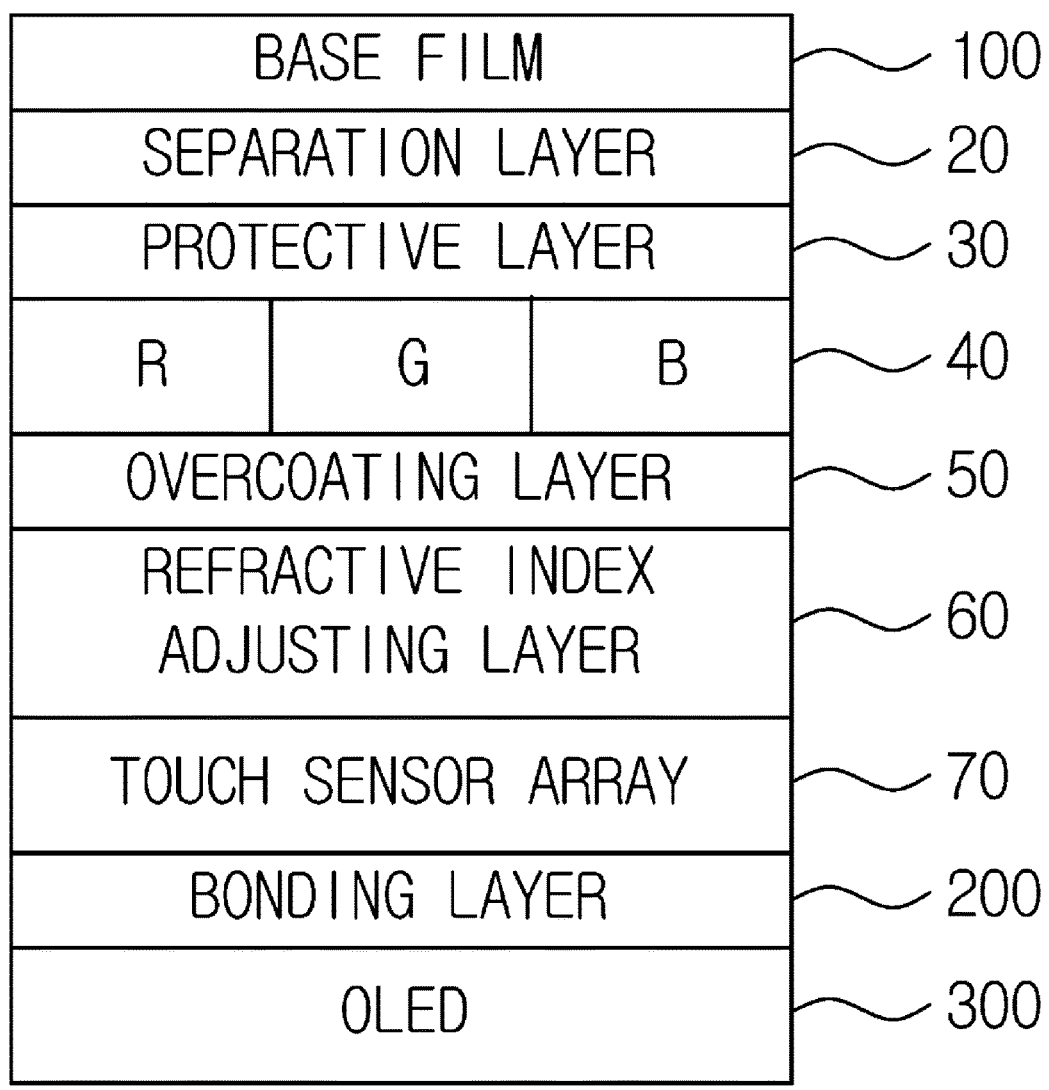

FIGS. 29 and 30 are process cross-sectional views of a manufacturing method of the flexible organic light-emitting display including the flexible color filter integrated with the touch sensor according to the first embodiment of the present invention.

Referring to FIGS. 29 and 30, the manufacturing method of the flexible organic light-emitting display according to the first embodiment of the present invention includes a process of bonding the OLED 300 to the flexible color filter integrated with the touch sensor manufactured through the manufacturing method of the flexible color filter integrated with the touch sensor according to the first embodiment of the present invention described above in detail with the bonding layer 200 interposed therebetween.

The manufacturing method of the flexible color filter integrated with the touch sensor according to the first embodiment of the present invention is applied to the manufacturing method of the flexible organic light-emitting display according to the first embodiment of the present invention in the same manner, and thus a description thereof will not be repeated.

According to the manufacturing method of the flexible organic light-emitting display according to the first embodiment of the present invention, the flexible organic light-emitting display is manufactured to have a structure in which the OLED 300, the touch sensor array 70, and the color filter array 40 are sequentially stacked.

Figure 31:
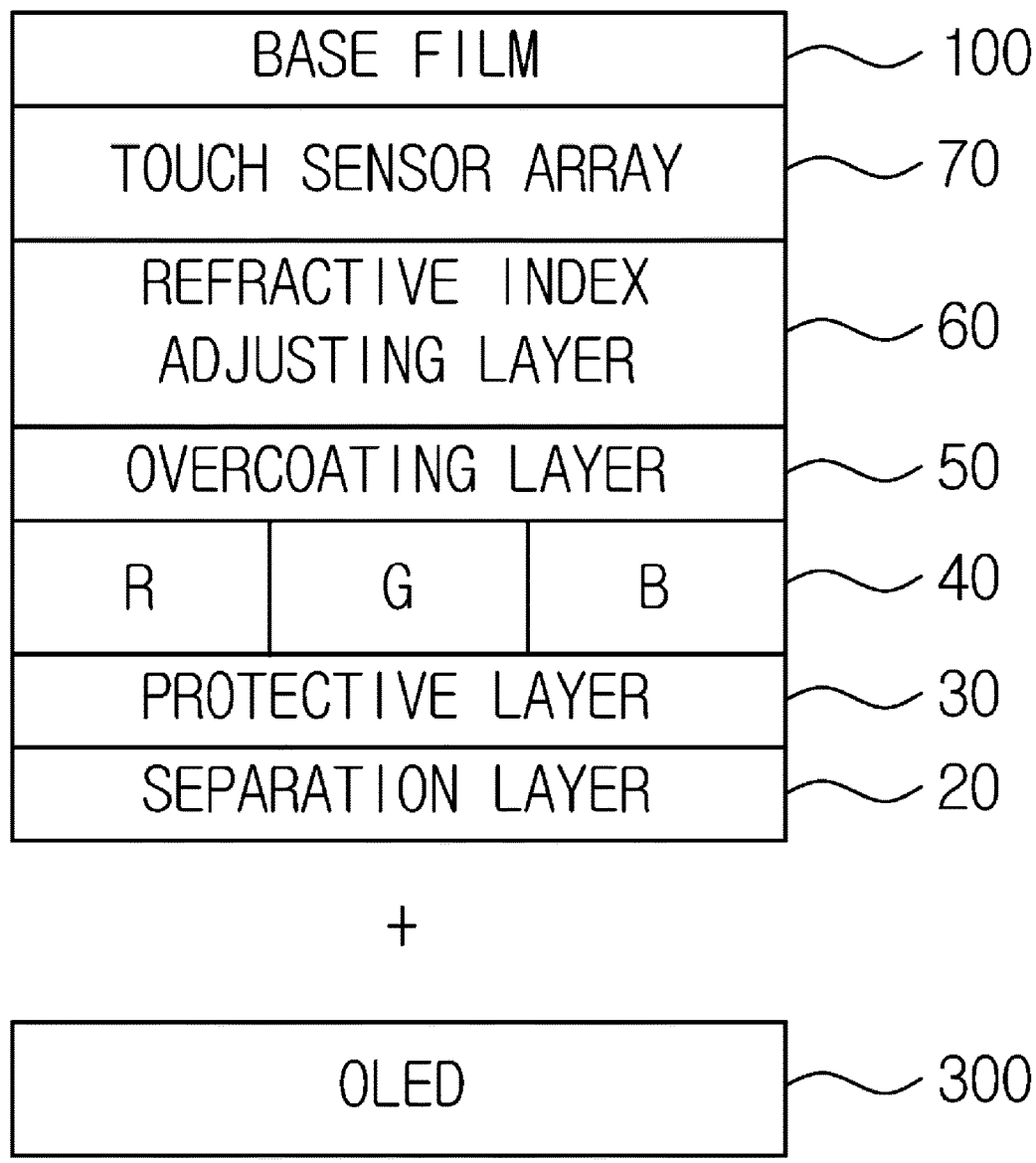
FIGS. 31 and 32 are process cross-sectional views of a manufacturing method of the flexible organic light-emitting display including the flexible color filter integrated with the touch sensor according to the second embodiment of the present invention.
Figure 32:
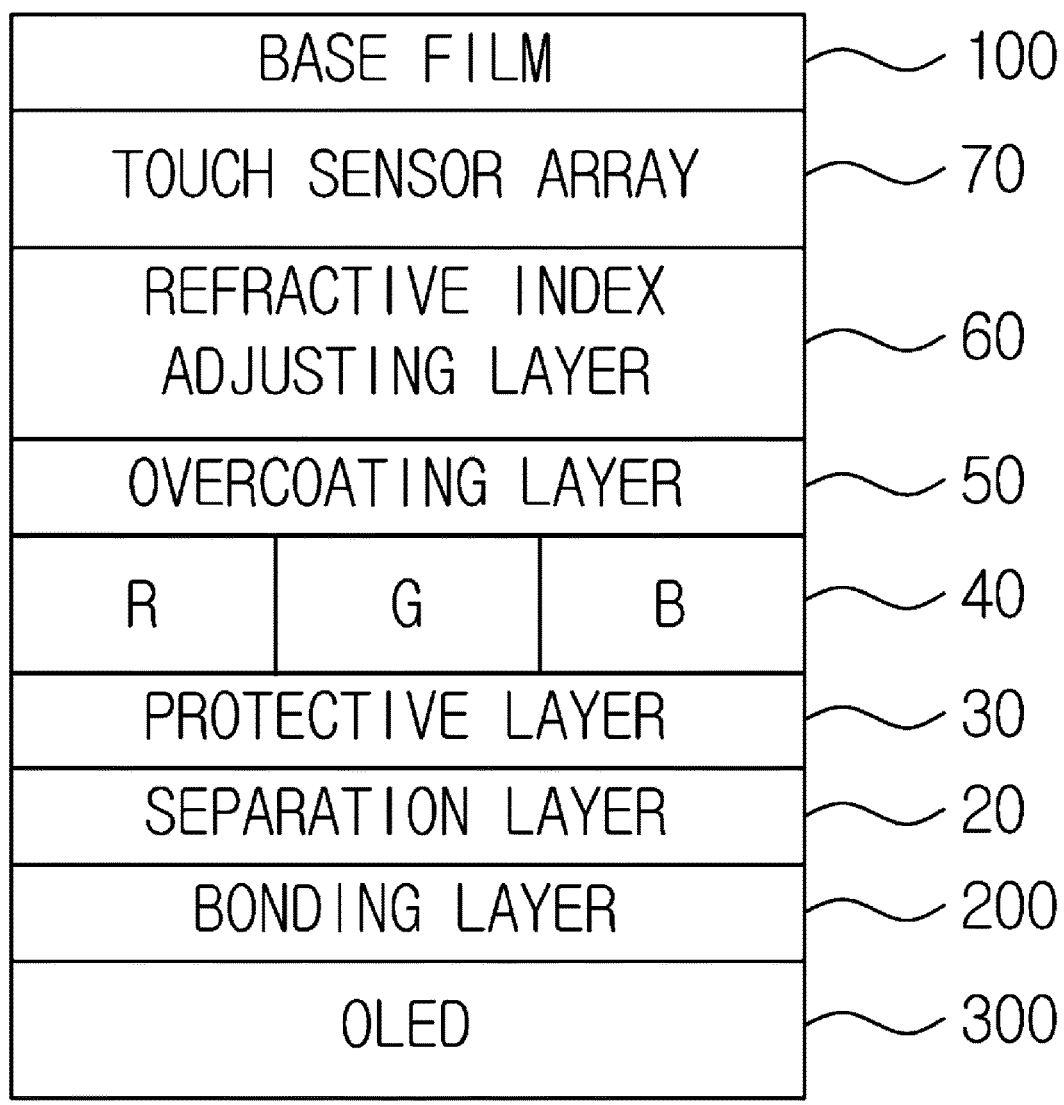

FIGS. 31 and 32 are process cross-sectional views of a manufacturing method of the flexible organic light-emitting display including the flexible color filter integrated with the touch sensor according to the second embodiment of the present invention.

Referring to FIGS. 31 and 32, the manufacturing method of the flexible organic light-emitting display according to the second embodiment of the present invention includes a process of bonding the OLED 300 to the flexible color filter integrated with the touch sensor manufactured through the manufacturing method of the flexible color filter integrated with the touch sensor according to the second embodiment of the present invention described above in detail with the bonding layer 200 interposed therebetween.

The manufacturing method of the flexible color filter integrated with the touch sensor according to the second embodiment of the present invention is applied to the manufacturing method of the flexible organic light-emitting display according to the second embodiment of the present invention in the same manner, and thus a description thereof will not be repeated.

According to the manufacturing method of the flexible organic light-emitting display according to the second embodiment of the present invention, the flexible organic light-emitting display is manufactured to have a structure in which the OLED 300, the color filter array 40, and the touch sensor array 70 are sequentially stacked.

As described above, according to the present invention, a high light reflectance of an organic light-emitting display can be reduced by replacing an antireflective polarizer provided in the organic light-emitting display with a color filter.

Further, two functional devices can be provided on one base film by integrating a touch sensor with a color filter.

Further, the number of optical bonding layers required in a process of attaching a touch sensor and a color filter to an organic light-emitting display can be reduced by integrating the touch sensor with the color filter so that a manufacturing process of the organic light-emitting display can be simplified and optical properties thereof can be improved.

Further, a flexible property of an organic light-emitting display can be improved by reducing a thickness of a film in which a touch sensor and a color filter are integrated.

Further, the color reproducibility of an organic light-emitting display can be improved by using a color filter in place of a conventional polarizer.

Further, the selectivity with respect to a base film can be increased by using various base films which are very thin and have high optical and flexible properties in place of a conventional rigid substrate.

The invention claimed is:

1. A manufacturing method of a flexible color filter integrated with a touch sensor, the manufacturing method comprising:
    forming a separation layer on a carrier substrate;
    forming a color filter array on one surface of the separation layer;
    forming an overcoating layer on the color filter array;
    forming a touch sensor array on the overcoating layer;
    forming a refractive index adjusting layer between the color filter array and the touch sensor array;
    forming a first protective film on the touch sensor array;
    separating the carrier substrate from the separation layer;
    forming a second protective film on the other surface of the separation layer;
    separating the first protective film, which is formed on the touch sensor array, from the touch sensor array; and
    forming a base film on the touch sensor array.

2. The manufacturing method of claim 1, further comprising forming a protective layer between the separation layer and the color filter array.

3. The manufacturing method of claim 1, wherein a refractive index of the refractive index adjusting layer ranges from 1.5 to 1.87.

4. A manufacturing method of an organic light-emitting display including a flexible color filter integrated with a touch sensor, the manufacturing method comprising:
    forming a separation layer on a carrier substrate;
    forming a color filter array on one surface of the separation layer;
    forming an overcoating layer on the color filter array;
    forming a touch sensor array on the overcoating layer;
    forming a first protective film on the touch sensor array;
    separating the carrier substrate from the separation layer;

forming a second protective film on the other surface of the separation layer;

separating the first protective film, which is formed on the touch sensor array, from the touch sensor array;

forming a base film on the touch sensor array; and bonding the separation layer to an organic light-emitting diode with a bonding layer interposed therebetween.

5. The manufacturing method of claim 4, further comprising forming a protective layer between the separation layer and the color filter array.

6. The manufacturing method of claim 4, further comprising forming a refractive index adjusting layer between the color filter array and the touch sensor array.

7. The manufacturing method of claim 6, wherein a refractive index of the refractive index adjusting layer ranges from 1.5 to 1.87.

* * * * *